(12) United States Patent
Aikawa et al.

(10) Patent No.: US 6,192,004 B1
(45) Date of Patent: Feb. 20, 2001

(54) SEMICONDUCTOR INTEGRATED CIRCUIT

(75) Inventors: Tadao Aikawa; Yasuharu Sato, both of Kawasaki (JP)

(73) Assignee: Fujitsu Limited, Kawasaki (JP)

( * ) Notice: Under 35 U.S.C. 154(b), the term of this patent shall be extended for 0 days.

(21) Appl. No.: 09/559,743

(22) Filed: Apr. 27, 2000

(30) Foreign Application Priority Data

Jul. 12, 1999 (JP) .................................................. 11-197680

(51) Int. Cl.[7] .................................................... G11C 8/00
(52) U.S. Cl. ..................... 365/233; 365/230.09; 365/239
(58) Field of Search .............................. 365/233, 230.09, 365/239, 220, 221, 189.04

(56) References Cited

U.S. PATENT DOCUMENTS

| | | | |
|---|---|---|---|
| 5,889,936 | * 3/1999 | Chan | 395/183.15 |
| 5,950,223 | * 9/1999 | Chiang et al. | 700/105 |
| 5,973,991 | * 10/1999 | Tsuchida et al. | 365/233 |
| 6,134,179 | * 3/1999 | Ooishi | 365/233 |

* cited by examiner

Primary Examiner—Richard Elms
Assistant Examiner—Hien Nguyen

(74) Attorney, Agent, or Firm—Arent Fox Kintner Plotkin & Kahn PLLC

(57) ABSTRACT

A clock pulse generator generates a plurality of clock pulses which has different phases during one cycle of a reference clock signal supplied from the exterior. A timing setting circuit sets a latency, which is a number of clock cycles from a start of a read operation to an output of read data, at a number which is divisible by one n-th (n=2, 3, 4 . . . ) of a cycle of the reference clock signal and outputs latency information according to the set latency. An output controlling pulse switching circuit respectively outputs each of the clock pulses as a predetermined output controlling pulse in accordance with the latency information. In other words, a plurality of the output controlling pulses are switched according to the latency information. In synchronization with each of the output controlling pulses, a data outputting circuit sequentially and respectively converts parallel data, read from a plurality of memory cells stored with data, into serial data and respectively outputs the converted serial data during the predetermined period according to the latency. No matter what timing of the reference clock signal the latency might be set at, therefore, the serial data can be reliably outputted without switching the parallel data. The data are outputted at high speed because the parallel data need not be switched.

6 Claims, 18 Drawing Sheets

SEMICONDUCTOR INTEGRATED CIRCUIT

BACKGROUND OF THE INVENTION

1. Field of the Invention

The present invention relates to a semiconductor integrated circuit for outputting data signals read from memory cells at a plurality of times during one cycle of a clock signal and, more particularly, to a technology for outputting the data signals at high speed.

2. Description of the Related Art

Recently, the SDRAM (Synchronous DRAM) or the like has been developed as a semiconductor integrated circuit for outputting data signals at high speed by operating an input/output interface at high speed in synchronization with a clock signal or the like. The DDR-SDRAM (Double Data Rate Synchronous DRAM) has also been developed as a semiconductor integrated circuit for outputting data in synchronization with each rise of complementary clock signals (or both a rise and a fall of a clock signal).

FIG. 1 shows an example of the construction of such an output controlling unit 1 of the semiconductor integrated circuit of the kind as to control the output of the data signal of the DDR-SDRAM.

The output controlling unit 1 comprises a clock pulse generator 2, a read controlling circuit 3, an output enable switching circuit 4, a data transmitting circuit 5, a data switching circuit 6, and a data output circuit 7.

The clock pulse generator 2 receives clock signals CLKZ and CLKX and outputs clock pulses OCLKPZ and OCLKPX respectively in synchronization with the rises of the clock signals CLKZ and CLKX. These clock signals CLKZ and CLKX are signals which have received complementary external clock signals CLK and /CLK (not shown) supplied from the exterior by a clock buffer.

The read controlling circuit 3 includes a latency counter 8, a latency controlling circuit 9 and a data converting pulse switching circuit 10.

The latency counter 8 receives the clock pulse OCLKPZ and a read controlling signal RDPZ, outputs latency delay signals LAT30Z and LAT40Z. The read controlling signal RDPZ changes to a high level during a predetermined period when a read command is received from the exterior.

The latency controlling circuit 9 receives the clock pulse OCLKPX, the latency delay signals LAT30Z, LAT40Z and latency controlling signals DL40Z, DL45Z and outputs output controlling signals OE30Z, POE35Z, and POE40Z.

The latency controlling signals DL40Z and DL45Z are generated according to the set value of a mode register(not shown). When the mode register is set at "latency 4", for example, the latency controlling signal DL40Z changes to a high level and the latency controlling signal DL45Z changes to a low level. When the mode register is set at "latency 4.5", the latency controlling signal DL40Z changes to the low level and the latency controlling signal DL45Z changes to the high level. Here, the "latency" is a number of clock cycles from the receipt of the read command to the start of outputting the data. In the read operation after the writing operation, for example, by setting the "latency" at a number which is divisible by 0.5, the period during which a data signal DQ is not to be transmitted is minimized so that the usage rate of the data bus can be increased.

The data converting pulse switching circuit 10 receives the clock pulses OCLKPZ and OCLKPX, the output controlling signal OE30Z and the latency controlling signals DL40Z and DL45Z, and outputs data converting pulses PSCLKLN and PSCLK2N.

The output enable switching circuit 4 receives the output controlling signals, POE35Z and POE40Z and the latency controlling signals DL40Z and DL45Z, and outputs the output controlling signals OE30Z, POE35Z and POE40Z.

The data transmitting circuit 5 receives data signals CDB01X and CDB02X, as read from the memory cells(not shown), and the data converting pulses PSCLK1N and PSCLK2N, and outputs data signals DT1Z and DT2Z.

The data switching circuit 6 receives the data signals DT1Z, DT2Z and the latency controlling signals DL40Z, DL45Z, and outputs data signals PSDT1Z and PSDT2Z.

The data output circuit 7 receives the clock pulses OCLKPZ and OCLKPX, the output controlling signals OE35Z and OE40Z, and the data signals PSDT1Z and PSDT2Z, and outputs a data signal DOUT to a pad PAD.

FIG. 2 shows a detail of the clock pulse generator 2.

The clock pulse generator 2 comprises identical pulse generators 11a and 11b. The pulse generator 11a has a delay circuit 12a for generating a delay signal CLKDZ inverted and delayed from the clock signal CLKZ, and a 2-input AND gate 12b for receiving the clock signal CLKZ and the delay signal CLKDZ and generating the clock pulse OCLKPZ. In the delay circuit 12a, there are arranged CR time constant circuits 12c between five inverters connected in cascade. The CR time constant circuit 12c includes a diffusion resistor R1 and a MOS capacitor C1 connecting the source and drain of an nMOS with a grounded line VSS. The pulse generator 11b receives the clock signal CLKX and generates the clock pulse OCLKPX. The clock pulse generator 2 generates clock pulses OCLKPZ and OCLKPX in synchronization with the rises of the clock signals CLKZ and CLKX.

FIG. 3 shows a detail of the latency counter 8.

This latency counter 8 includes three latch circuits 13a, 13b, and 13c connected in cascade, and a plurality of inverters.

Each of the latch circuits 13a, 13b, and 13c has a cascade connection of: a CMOS transmission gate 15 to be turned on when the clock pulse OCLKPZ is at the low level; a latch 16 including an inverter 16a the input and output of which are connected with the output and input of a clocked inverter 16b; a CMOS transmission gate 17 to be turned on when the clocked pulse OCLKPZ is at the high level; and a latch 18 having two inverters connected with each other at their inputs and outputs.

The CMOS transmission gates 15 and 17 are formed by connecting the sources and drains of nMOS and pMOS with each other. A pMOS 16c of the clocked inverter 16b formed on the feedback side of the latch 16 receives at its gate the inverted signal of the clock pulse OCLKPZ, and an nMOS 16d receives at its gate a signal of the same logic as that of the clock pulse OCLKPZ. The latches 13a, 13b and 13c are circuits for accepted signals when the clock pulse OCLKPZ is at the low level, and outputting the accepted signals when the clock pulse OCLKPZ is at the high level. The input of the latch circuit 13a receives the read controlling signal RDPZ. The latch circuit 13b outputs the latency delay signal LAT30Z. The latch circuit 13c outputs the latency delay signal LAT40Z. In other words, the latency counter 8 raises the latency delay signals LAT30Z and LAT40Z to the high level in synchronization with the rises of the third clock and the fourth clock of the clock pulse OCLKPZ after the receipt of a read command.

FIG. 4 shows a detail of the latency controlling circuit 9.

This latency controlling circuit 9 includes: latch circuits 19a and 19b; CMOS transmission gates 20a, 20b and 20c to be turned on when the latency controlling signal DL40Z is at the high level; CMOS transmission gates 21a, 21b and 21c to be turned on when the latency controlling signal DL45Z is at the high level; and a plurality of inverters. The latch circuits 19a and 19b are identical to the latch circuit 13a of FIG. 3. The latch circuit 19a receives the latency delay signal LAT30Z, the inverted signal of the clock pulse OCLKPZ and a signal of the same logic as that of the clock pulse OCLKPZ and outputs the latency delay signal LAT35Z delayed by a half clock from the latency delay signal LAT30Z. The latch circuit 19b receives the latency delay signal LAT40Z, the inverted signal of the clock pulse OCLKPZ and a signal of the same logic as that of the clock pulse OCLKPZ, and outputs the latency delay signal LAT45Z delayed by a half clock from the latency delay signal LAT40Z.

The CMOS transmission gate 20a receives the latency delay signal LAT30Z and outputs it to a node N1. The CMOS transmission gate 20b receives the latency delay signal LAT35Z and outputs it to a node N2. The CMOS transmission gate 20c receives the latency delay signal LAT40Z and outputs it to a node N3. The CMOS transmission gate 21a receives the latency delay signal LAT35Z and outputs it to the node N1. The CMOS transmission gate 21b receives the latency delay signal LAT40Z and outputs it to the node N2. The CMOS transmission gate 21c receives the latency delay signal LAT45Z and outputs it to the node N3. The signal, as transmitted to the node N1, is outputted as the output controlling signal OE30Z through the two inverters. The signal, as transmitted to the node N2, is outputted as the output controlling signal POE35Z through the two inverters. The signal, as transmitted to the node N3, is outputted as the output controlling signal POE40Z through the two inverters.

In short, the latency controlling circuit 9 outputs the latency delay signals LAT30Z, LAT35Z and LAT40Z, respectively, as the output controlling signals OE30Z, POE40Z and POE45Z, when the mode register (not shown) is set at the "latency 4", and outputs the latency delay signals LAT35Z, LAT40Z and LAT45Z, respectively, as the output controlling signals OE30Z, POE40Z and POE45Z, when the mode register is set at the "latency 4.5".

FIG. 5 shows a detail of the data converting pulse switching circuit 10.

This data converting pulse switching circuit 10 includes: CMOS transmission gates 22a and 22b to be turned on when the latency controlling signal DL40Z is at the high level; CMOS transmission gates 23a and 23b to be turned on when the latency controlling signal DL45Z is at the high level; identical output circuits 24a and 24b; and a plurality of inverters.

The CMOS transmission gate 22a receives the clock pulse OCLKPX and outputs it to a node N4. The CMOS transmission gate 22b receives the clock pulse OCLKPZ and outputs it to a node N5. The CMOS transmission gate 23a receives the clock pulse OCLKPZ and outputs it to the node N4. The CMOS transmission gate 23b receives the clock pulse OCLKPX and outputs it to the node N5.

The output circuit 24a includes a control circuit 25 having an inverter 25a and two-input NAND gates 25b and 25c, a flip-flop circuit 26 having two-input NAND gates 26a and 26b, and a two-input AND gate 27. One input of the inverter 25a is connected with the node N4. One input of the NAND gate 25b receives the output controlling signal OE30Z. The other input of the NAND gate 25b is connected with the output of the inverter 25a. One input of the NAND gate 25c is connected with the output of the NAND gate 25b. The other input of the NAND gate 25c is connected with the output of the inverter 25a. The input of the NAND gate 26a is connected with the output of the NAND gate 25b. The input of the NAND gate 26b is connected with the output of the NAND gate 25c. The input of the AND gate 27 is connected with the node N4 and the output of the NAND gate 26a. The AND gate outputs the data converting pulse PSCLK1N.

The input of the inverter 25a of the output circuit 24b is connected with the node N5. One input of the NAND gate 25b of the output circuit 24b receives the output controlling signal OE30z. One input of the AND gate 27 of the output circuit 24b is connected with the node N5. The AND gate 27 of the output circuit 24b outputs the data converting pulse PSCLK2N.

The output circuits 24a and 24b detect the clock pulses OCLKPZ and OCLKPX, which rise during the high-level period of the output controlling signal OE30Z, and generates the data converting pulses PSCLK1N and PSCLK2N.

In short, the data converting pulse switching circuit 10 outputs the clock pulses OCLKPX and OCLKPZ, respectively, as the data converting pulses PSCLK1N and PSCLK2N, when the mode register (not shown) is set at the "latency 4", and outputs the clock pulses OCLKPZ and OCLKPX, respectively, as the data converting pulses PSCLKLN and PSCLK2N, when the mode register is set at the "latency 4.5".

FIG. 6 shows a detail of the output enable switching circuit 4.

This output enable switching circuit 4 includes: CMOS transmission gates 28a and 28b to be turned on when the latency controlling signal DL40Z is at the high level; CMOS transmission gates 29a and 29b to be turned on when the latency controlling signal DL45Z is at the high level; and a plurality of inverters.

The CMOS transmission gate 28a receives the inverted signal of the output controlling signal POE35Z through the inverter and outputs that signal to a node N6. The CMOS transmission gate 28b receives the inverted signal of the output controlling signal POE40Z through the inverter and outputs that signal to a node N7. The CMOS transmission gate 29a receives the inverted signal of the output controlling signal POE40Z through the inverter and outputs that signal to the node N6. The CMOS transmission gate 29b receives the inverted signal of the output controlling signal POE35Z through the inverter and outputs that signal to the node N7.

The signal, as transmitted to the node N6, is outputted as the output controlling signal OE35Z through the inverter. The signal, as transmitted to the node N7, is outputted as the output controlling signal OE40Z through the inverter.

The output enable switching circuit 4 outputs the output controlling signals POE35Z and POE40Z, respectively, as the output controlling signals OE35Z and OE40Z, when the mode register is set at the "latency 4", and outputs the output controlling signals POE40Z and POE35Z, respectively, as the output controlling signals OE35Z and OE40Z, when the mode register is set at the "latency 4.5".

FIG. 7 shows a detail of the data transmitting circuit 5.

The data transmitting circuit 5 includes: CMOS transmission gates 30a and 30b to be turned on when the data converting pulse PSCLK1N is at the high level; a CMOS transmission gate 30c to be turned on when the data converting pulse PSCLK2N is at the high level; latches 30d, 30e and 30f connecting the inputs and outputs of two inverters; and a plurality of inverters.

The CMOS transmission gate 30a receives the data signal CDB01X and outputs it to the latch 30d. This latch 30d outputs the inverted logic of the data signal CDB01X as the data signal DT1Z. The CMOS transmission gate 30b receives the data signal CDB02X and outputs it to the latch 30e. This latch 30e outputs the inverted signal of the data signal CDB02 to the CMOS transmission gate 30c. This CMOS transmission gate 30c outputs this signal to the latch 30f. This latch 30f inverts the received signal and outputs it to an inverter 30g. This inverter 30g outputs the inverted signal of the data signal CDB02 as the data signal DT2Z.

FIG. 8 shows a detail of the data switching circuit 6.

This data switching circuit 6 includes: CMOS transmission gates 31a and 31b to be turned on when the latency controlling signal DL40Z is at the high level; CMOS transmission gates 32a and 32b to be turned on when the latency controlling signal DL45Z is at the high level; and a plurality of inverters.

The CMOS transmission gate 31a receives the inverted signal of the data signal DT1Z through the inverter and outputs it to a node N8. The CMOS transmission gate 31b receives the inverted signal of the data signal DT2Z through the inverter and outputs it to a node N9. The CMOS transmission gate 32a receives the inverted signal of the data signal DT2Z through the inverter and outputs it to the node N8. The CMOS transmission gate 32b receives the inverted signal of the data signal DT1Z through the inverter and outputs it to the node N9.

The signal, as transmitted to the node N8, is outputted as the data signal PSDT1Z through the inverter. The signal, as transmitted to the node N9, is outputted as the data signal PSDT2Z through the inverter.

The data switching circuit 6 outputs the data signals DT1Z and DT2Z, respectively, as the data signals PSDT1Z and PSDT2Z, when the mode register is set at the "latency 4", and outputs the data signals DT2Z and DT1Z, respectively, as the data signals PSDT1Z and PSDT2Z, when the mode register is set at the "latency 4.5".

FIG. 9 shows a detail of the data output circuit 7.

This data output circuit 7 includes two-input NAND gates 33a and 33b, two-input NOR gates 33c and 33d, CMOS transmission gates 34a and 34b, CMOS transmission gates 35a and 35b, latches 36a and 36b, a PMOS 37a, an nMOS 37b, and a plurality of inverters.

The CMOS transmission gates 34a and 34b are turned on when the clock pulse OCLKPZ is at the high level. The CMOS transmission gates 35a and 35b are turned on when the clock pulse OCLKPX is at the high level. The latches 36a and 36b are constructed of two CMOS inverters having inputs and outputs connected with each other. The pMOS 37a has a source connected with the power source line VDD and a drain connected with the pad PAD. This pMOS 37a outputs the data signal DOUT at the high level. The nMOS 37b has a source connected with the grounded line VSS and a drain connected with the PAD. The nMOS 37b outputs the data signal DOUT at the low level.

The input of the NAND gate 33a receives the output controlling signal OE35Z and the data signal PSDT1Z. The input of the NAND gate 33b receives the output controlling signal OE40Z and the data signal PSDT2Z. The input of the NOR gate 33c receives the inverted signal of the output controlling signal OE35Z and the data signal PSDT1Z through the inverter. The input of the NOR gate 33d receives the inverted signal of the output controlling signal OE40Z and the data signal PSDT2Z through the inverter.

The CMOS transmission gate 34a is connected at its input with the output of the NAND gate 33a and at its output with a node N10. The CMOS transmission gate 34b is connected at its input with the output of the NOR gate 33c and at its output with a node N11. The CMOS transmission gate 35a is connected at its input with the output of the NAND gate 33b and at its output with the node N10. The CMOS transmission gate 35b is connected at its input with the output of the NOR gate 33d and at its output with the node N11.

The latch 36a receives the signal supplied to the node N10 and outputs the inverted signal to an inverter 38a. This inverter 38a inverts the received signal and outputs it as a control signal PU for controlling the output at the high level to the gate of the pMOS 37a. The latch 36b receives the signal supplied to the node N11 and outputs the inverted signal to an inverter 38b. This inverter 38b inverts the received signal and outputs it as a control signal PD for controlling the output at the low level to the gate of the nMOS 37b.

In the DDR-SDRAM described above, the read operation is performed as follows according to the "latency" set in the exterior.

FIG. 10 shows timings of the read operation when the "latency 4" is set.

The read operation is started by supplying a read command READ from the exterior. The DDR-SDRAM accepts the read command READ at the rise of the clock signal CLKZ and raises the read controlling signal RDPZ to the high level during about one cycle of the clock signal CLKZ (FIG. 10(b)). With the "latency 4", the latency controlling signal DL40Z is set to the high level, and the latency controlling signal DL45Z is set to the low level.

The clock pulse generator 2 of FIG. 2 outputs the clock pulses OCLKPZ and OCLKPX, respectively, in synchronization with the rises of the clock signals CLKZ and CLKX (FIG. 10(a)). The time constant of the delay circuit 12c is set so that the high-level periods of the clock pulses OCLKPZ and OCLKPX may not overlap.

The latency counter 8 of FIG. 3 outputs the latency delay signals LAT30Z and LAT40Z in synchronization with the rises of the clock pulses OCLKPZ of the third and fourth clocks (corresponding to the numeral, as indicated by waveforms) from the acceptance of the read command READ (FIG. 10(c)). The latency delay signals LAT30Z and LAT40Z change to the high level during about one cycle of the clock signal CLKZ.

The latency controlling circuit 9 of FIG. 4 receives the high level of the latency controlling signal DL40Z and outputs: the latency delay signal LAT30Z as the output controlling signal OE30Z; the latency delay signal LAT35Z delayed by a half clock from the latency delay signal LAT30Z as the output controlling signal POE35Z; and the latency delay signal LAT40Z as the output controlling signal POE40Z. In other words: the output controlling signal POE30Z is outputted in synchronization with the third clock of the clock pulse OCLKPZ; the output controlling signal POE35Z is outputted in synchronization with the third clock (corresponding to the numeral, as indicated by waveforms) of the clock pulse OCLKPX; and the output controlling signal POE40Z is outputted in synchronization with the fourth clock (corresponding to the numeral, as indicated by waveforms) of the clock pulse OCLKPX (FIG. 10(d)). Here, the individual signals OE30Z, POE35Z and POE40Z change to the high level during about one cycle of the clock signal CLKZ.

The output enable switching circuit 4 of FIG. 6 receives the high level of the latency controlling signal DL40Z and outputs the output controlling signal POE35Z and the output controlling signal POE40Z, respectively, as the output controlling signals OE35Z and OE40Z (FIG. 10(e)).

The data converting pulse switching circuit 10 of FIG. 5 receives the latency controlling signal DL40Z at the high level, accepts those of the clock pulses OCLKPZ and OCLKPX, which change to the high level during the high-level period of the output controlling signal OE30Z and outputs them as the data converting pulses PSCLK1N and PSCLK2N. Specifically, at the "latency 4" the data converting pulse PSCLK1N is outputted in synchronization with the third clock of the clock pulse OCLKPX, and the data converting pulse PSCLK2N is outputted in synchronization with the fourth clock of the clock pulse OCLKPZ (FIG. 10(f)).

The data transmitting circuit 5 of FIG. 7 accepts the data signal CDB01X at the low level (L) as read from the memory cell (not shown), in synchronization with the rise of the data converting pulse PSCLK1N, inverts the accepted signal, and outputs the inverted signal as the data signal DT1Z at the high level (H). It accepts the data signal CDB02X at the high level (H) in synchronization with the rise of the data converting pulse PSCLK2N, inverts the accepted signal, and outputs the inverted signal as the data signal DT2Z at the low level (L) (FIG. 10(g)).

Here, the data signals CDB01X and CDB02X have negative logics. Therefore, the logic level of the data signals CDB01X and CDB02X is inverted from that of the data signal DOUT to be outputted to the exterior.

The data switching circuit 6 of FIG. 8 receives the high level of the latency controlling signal DL40Z and outputs the data signals DT1Z and DT2Z, respectively, as the data signals PSDT1Z and PSDT2Z (FIG. 10(h)). At this time, the data signals PSDT1Z and PSDT2Z are outputted after a predetermined delay time T1 from the data signals DT1Z and DT2Z by the delay circuit of the data switching circuit 6.

The data output circuit 7 of FIG. 9 accepts the data signal PSDT1Z (at the high level) in synchronization with the rise of the clock pulse OCLKPZ generated during the high-level period of the output controlling signal OE35Z. The data output circuit 7 sets the control signal PU and the control signal PD to the low level and the high level, respectively, and outputs the data signal DOUT at the high level to the pad PAD in synchronization with the fourth rise of the clock signal CLKZ. Next, the data output circuit 7 accepts the data signal PSDT2Z (at the low level) in synchronization with the rise of the clock pulse OCLKPX which is generated during the high-level period of the output controlling signal OE40Z. The data output circuit 7 sets the control signal PU and the control signal PD, respectively, to the high level and the low level and outputs the data signal at the low level to the pad PAD in synchronization with the fourth fall of the clock signal CLKZ. As a result, the inverted signals of the data signals CDB01X and CDB02X read from the memory cells are sequentially outputted to the exterior in synchronization with the rise and fall of the clock signal CLKZ (or in synchronization with the rises of the clock signals CLKZ and CLKX, respectively) (in FIG. 10(i)).

FIG. 11 shows timings of the read operation when the "latency 4.5" is set. With the "latency 4.5", the latency controlling signal DL40Z is set to the low level, and the latency controlling signal DL45Z is set to the high level. Here will be omitted the description of the generation timings of the clock pulses OCLKPZ and OCLKPX, the read controlling signal RDPZ and the latency delay signals LAT30Z and LAT40Z, because they are identical to those of FIG. 10.

In response to the high level of the latency controlling signal DL45Z, the latency controlling circuit 9 of FIG. 4 outputs the latency delay signal LAT35Z delayed by a half clock from the latency delay signal LAT30Z, as the output controlling signal OE30Z, the latency delay signal LAT40Z as the output controlling signal POE35Z, and the latency delay signal LAT45Z delayed by a half clock from the latency delay signal LAT40Z, as the output controlling signal POE40Z. In other words: the output controlling signal OE30Z is outputted in synchronization with the third clock of the clock pulse OCLKPX; the output controlling signal POE35Z is outputted in synchronization with the fourth clock of the clock pulse OCLKPZ; and the output controlling signal POE40Z is outputted in synchronization with the fourth clock of the clock pulse OCLKPX (FIG. 11(a)).

In response to the high level of the latency controlling signal DL45Z, the output enable switching circuit 4 of FIG. 6 outputs the output controlling signal POE35Z and the output controlling signal POE40Z, respectively, as the output controlling signals OE40Z and OE35Z (FIG. 11(b)). In short, the output controlling signals OE40Z and OE35Z are switched by those for the "latency 4".

In response to the high level of the latency controlling signal DL45Z, the data converting pulse switching circuit 10 of FIG. 5 outputs, among of the clock pulses OCLKPZ and OCLKPX, the signals which change to the high level during the high-level period of the output controlling signal OE30Z, respectively, as the data converting pulses PSCLK1N and PSCLK2N. Specifically, the data converting pulse PSCLK1N is outputted in synchronization with the fourth clock of the clock pulse OCLKPZ, and the data converting pulse PSCLK2N is outputted in synchronization with the fourth clock of the clock pulse OCLKPX (FIG. 11(c)).

The data transmitting circuit 5 of FIG. 7 accepts the data signal CDB01X at the low level (L) as read from the (not shown) memory cell, in synchronization with the rise of the data converting pulse PSCLK1N, inverts the accepted signal, and outputs the inverted signal as the data signal DT1Z at the high level (H). On the other hand, the data transmitting circuit 5 accepts the data signal CDB02X at the high level (H) in synchronization with the rise of the data converting pulse PSCLK2N, inverts the accepted signal, and outputs the inverted signal as the data signal DT2Z at the low level (L) (FIG. 11(d)).

In response to the high level of the latency controlling signal DL45Z, the data switching circuit 6 of FIG. 8 outputs the data signals DT1Z and DT2Z, respectively, as the data signals PSDT2Z and PSDT1Z (FIG. 11(e)). In short, the data signals PSDT2Z and PSDT1Z are switched by those for the "latency 4". On the other hand, the data signals PSDT1Z and PSDT2Z are outputted after the delay of a predetermined time T1 from the data signals DT1Z and DT2Z by the circuit delay of the data switching circuit 6.

The data output circuit 7 of FIG. 9 accepts the data signal PSDT2Z (at the high level) in synchronization with the rise of the clock pulse OCLKPX. This clock pulse OCLKPX is generated during the high-level period of the output controlling signal OE40Z which is outputted earlier than the output controlling signal OE35Z. The data output circuit 7 sets the control signal PU and the control signal PD, respectively, to the low level and the high level, and outputs the data signal DOUT at the high level to the pad PAD in synchronization with the fourth fall of the clock signal CLKZ. Next, the data output circuit 7 accepts the data signal PSDT1Z (at the low level) in synchronization with the rise of the clock pulse OCLKPZ which is generated during the high-level period of the output controlling signal OE35Z. The data output circuit 7 sets the control signal PU and the control signal PD, respectively, to the high level and the low level, and outputs the data signal DOUT at the low level to the pad PAD in synchronization with the fifth rise of the clock signal CLKZ. As a result, the inverted signals of the data signals CDB01X and CDB02X read from the memory cells are sequentially outputted to the exterior in synchronization with the rise and fall of the clock signal CLKZ (or in synchronization with the rises of the clock signals CLKZ and CLKX, respectively) (FIG. 11(f)).

Here in the DDR-SDRAM of the prior art, when the "latency 4.5" is set, the output of the data signal DOUT is started from the fall of the clock signal CLK (or the rise of the clock signal CLKX). At this time, the output enable switching circuit 4 switches the output controlling signals OE35Z and OE40Z, and the data switching circuit 6 switches the data signals PSDT1Z and PSDT2Z. Moreover, the data output circuit 7 outputs the switched data signals PSDT1Z and PSDT2Z sequentially by using the switched output controlling signals OE35Z and OE40Z and the clock pulses OCLKPZ and OCLKPX which are generated by the clock pulse generator 2. As a result, this causes a problem that the generating timings of the data signals PSDT1Z and PSDT2Z are delayed by the time T1 corresponding to the circuit delay of the data switching circuit 6, as shown in FIGS. 10 and 11, so that the output timing of the data signal DOUT is delayed. The timing margin of the control signal required for controlling the data signals PSDT1Z and PSDT2Z is longer than the delay time of the data signals PSDT1Z and PSDT2Z. As a result, there arises a problem that the access time in the read operation is longer than the delay time of the data signals PSDT1Z and PSDT2Z. This elongation of the access time prevents the increase in the frequency of the clocks.

SUMMARY OF THE INVENTION

An object of the invention is to provide a semiconductor integrated circuit capable of outputting data read from memory cells at high speed.

According to one of the aspects of the semiconductor integrated circuit in the present invention, a clock pulse generator generates a plurality of clock pulses which has different phases during one cycle of a reference clock signal supplied from the exterior. A timing setting circuit sets a latency, which is a number of clock cycles from a start of a read operation to an output of read data, at a number which is divisible by one n-th (n=2, 3, 4 . . . ) of a cycle of the reference clock signal and outputs latency information according to the set latency. An output controlling pulse switching circuit respectively outputs each of the clock pulses as a predetermined output controlling pulse in accordance with the latency information. In other words, a plurality of the output controlling pulses are switched according to the latency information. In synchronization with each of the output controlling pulses, a data outputting circuit sequentially and respectively converts parallel data, read from a plurality of memory cells stored with data, into serial data and respectively outputs the converted serial data during the predetermined period according to the latency.

No matter what timing of the reference clock signal the latency might be set at, therefore, the serial data can be reliably outputted without switching the parallel data. The data are outputted at high speed because the parallel data need not be switched. In other words, the data can be outputted in the same latency even when the frequency of the reference clock signal is increased.

In another aspect of the semiconductor integrated circuit in the present invention, a data converting pulse switching circuit respectively outputs each of the clock pulses as a predetermined data converting pulse in accordance with the set latency information. A data transmitting circuit sequentially transmits the parallel data to the data outputting circuit in synchronization with the data converting pulses. Therefore, the parallel data are always transmitted to the data outputting circuit in the predetermined sequence. The data outputting circuit reliably receives the parallel data, converts the received parallel data into the serial data, and outputs the serial data.

According to still another aspect of the semiconductor integrated circuit in the present invention, a clock pulse generator respectively generates a first and a second clock pulses in synchronization with the rises of a complementary first and a second reference clock signals supplied from the exterior. A timing setting circuit sets a latency, which is a number of clock cycles from a start of a read operation to an output of read data, at a number which is divisible by half a cycle of the reference clock signal, and outputs latency information according to the set latency. An output controlling pulse switching circuit respectively outputs the first and the second clock pulses as either one of the first or the second output controlling pulse in accordance with the set latency information. In synchronization with the first and the second output controlling pulses, a data outputting circuit sequentially and respectively converts parallel data, read from a plurality of memory cells stored with data, into serial data and respectively outputs the converted serial data during the predetermined period according to the latency.

No matter which of the rise or fall of the reference clock signal the latency might be set at, therefore, the serial data can be reliably outputted without switching the parallel data. The data are outputted at high speed because the parallel data need not be switched. The first and second clock pulses are respectively generated from the first and second complementary reference clock signals supplied from the exterior, so that the clock pulse generator can be constructed of simple circuits.

According to further aspect of the semiconductor integrated circuit in the present invention, a clock pulse generator respectively generates a first and a second clock pulses in synchronization with the rise and fall of a reference clock signal supplied from the exterior. A timing setting circuit sets a latency, which is a number of clock cycles from a start of a read operation to an output of read data, at a number which is divisible by half a cycle of the reference clock signal, and outputs latency information according to the set latency. An output controlling pulse switching circuit respectively outputs the first and the second clock pulses as either one of the first or the second output controlling pulse in accordance with the set latency information. In synchronization with the first and the second output controlling pulses, a data outputting circuit sequentially and respectively converts parallel data, read from a plurality of memory cells stored with data, into serial data and respectively outputs the converted serial data during the predetermined period according to the set latency.

No matter which of the rise or fall of the reference clock signal the latency might be set at, therefore, the serial data can be reliably outputted without switching the parallel data. The data are outputted at high speed because the parallel data need not be switched. The first and the second clock pulses are respectively generated from the reference clock signal supplied from the exterior so that the number of terminals of the clock signal is reduced.

In further aspect of the semiconductor integrated circuit in the present invention, a data converting pulse switching circuit respectively outputs the first and second clock pulses as either one of a first or a second data converting pulse in accordance with the set latency information. A data transmitting circuit sequentially transmits the parallel data to the data outputting circuit in synchronization with the first and the second data converting pulses. Therefore, the parallel data are always transmitted in the predetermined sequence to the data outputting circuit. The data outputting circuit reliably receives the parallel data, converts the received parallel data into the serial data, and outputs the serial data.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Figure 1:
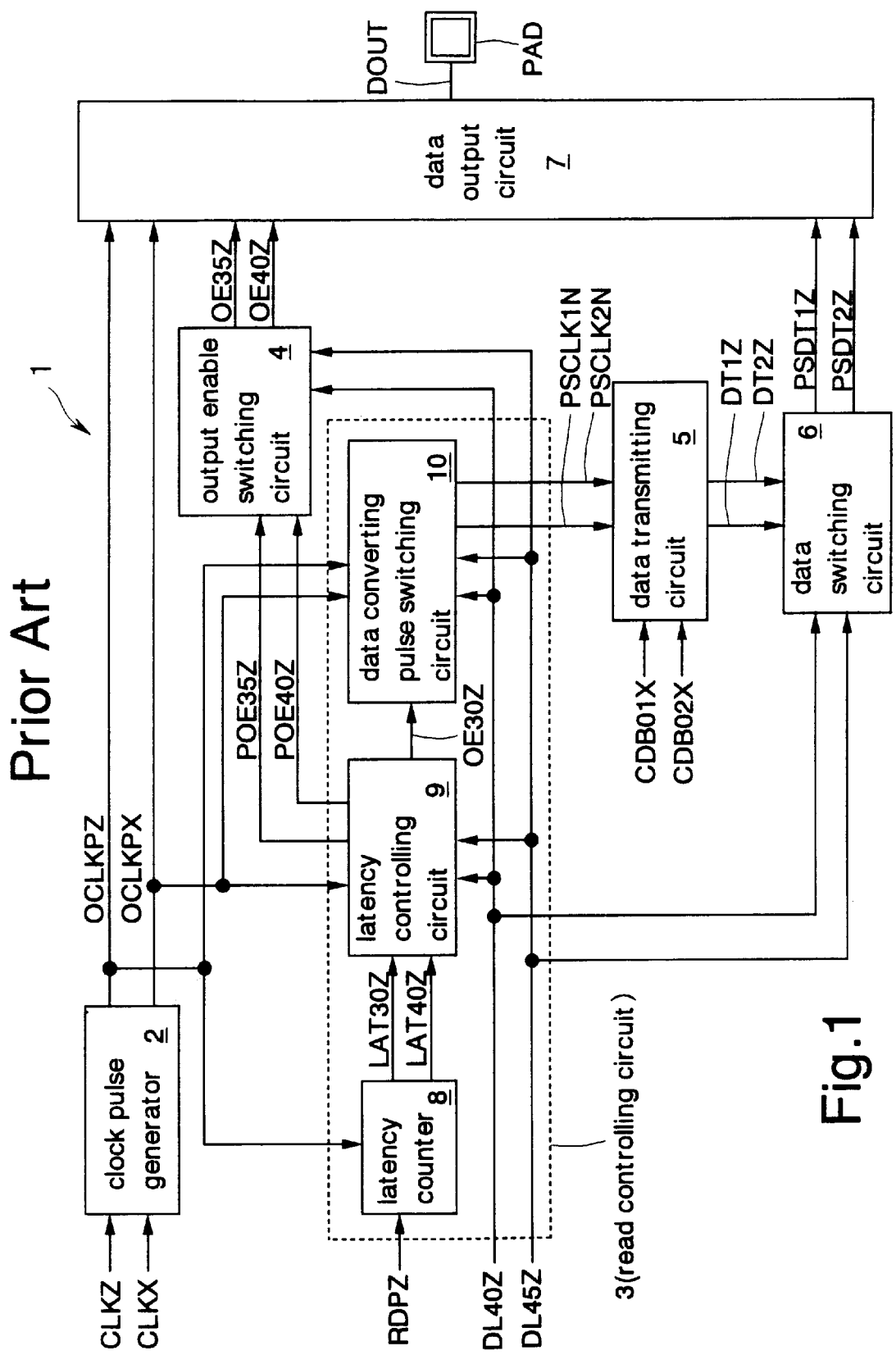
FIG. 1 is a block diagram showing an output controlling unit in the DDR-SDRAM of the prior art.
Figure 2:
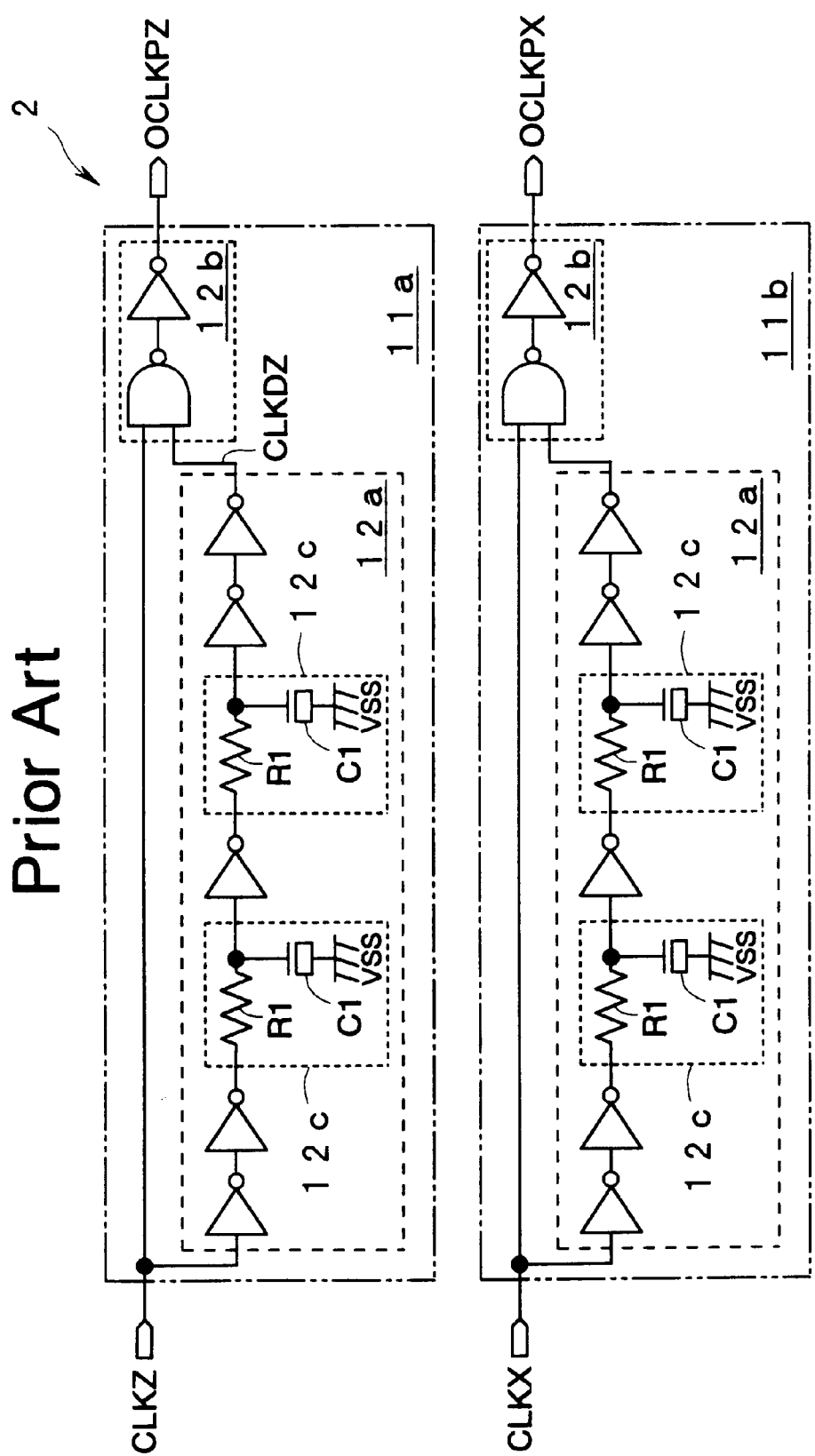
FIG. 2 is a circuit diagram showing a clock pulse generator of the prior art.
Figure 3:
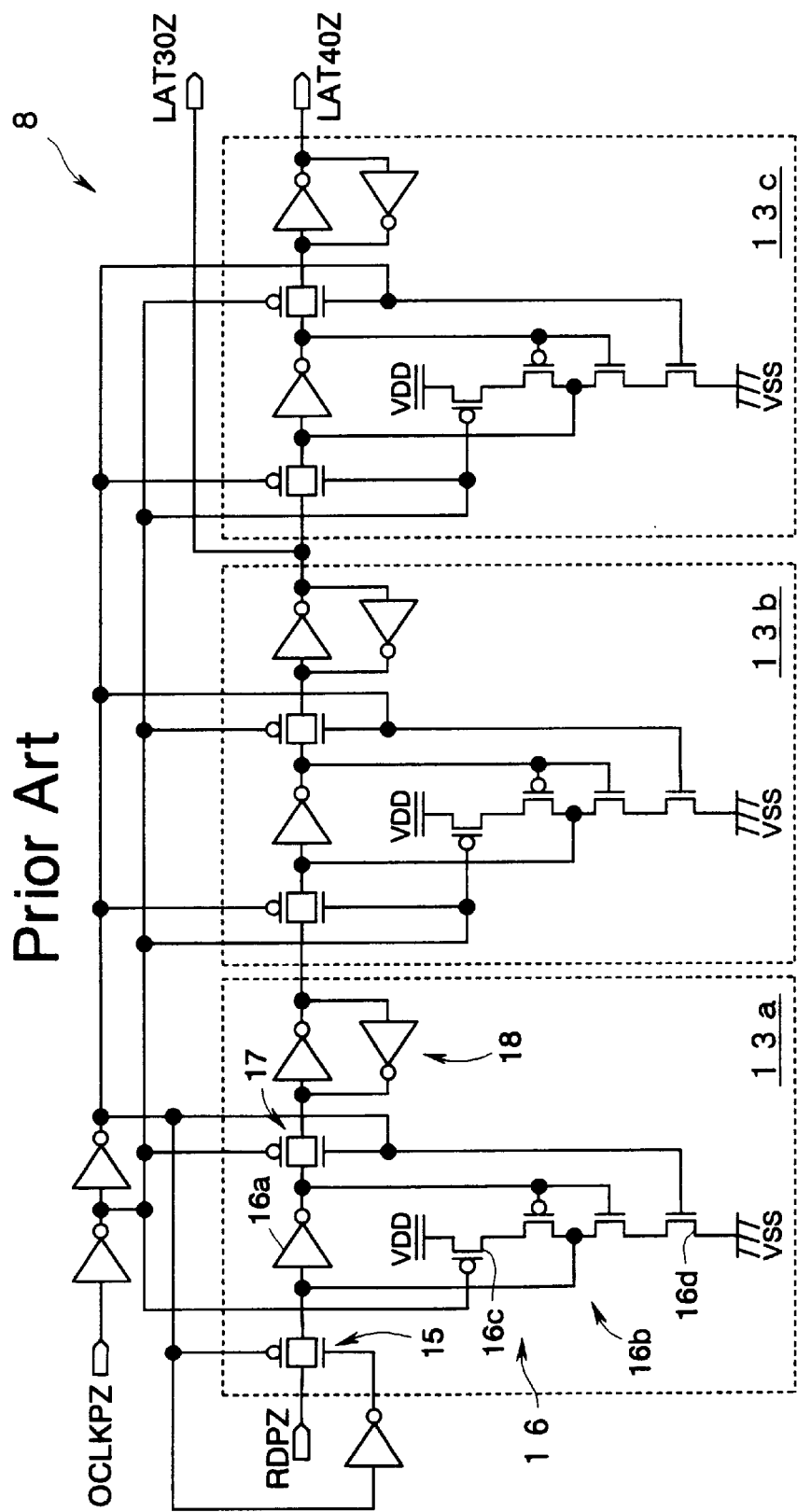
FIG. 3 is a circuit diagram showing a latency counter of the prior art.
Figure 4:
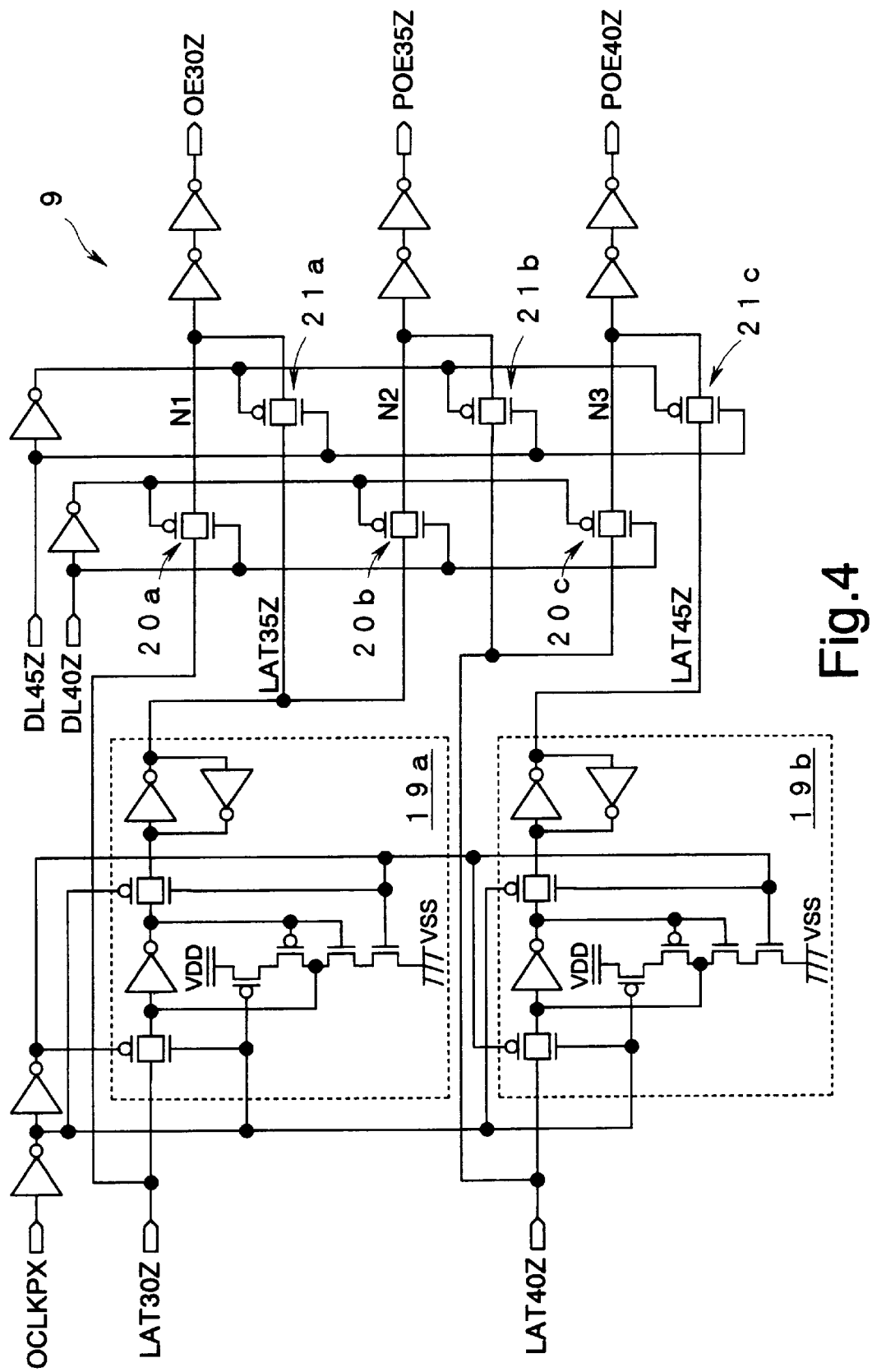
FIG. 4 is a circuit diagram showing a latency controlling circuit of the prior art.
Figure 5:
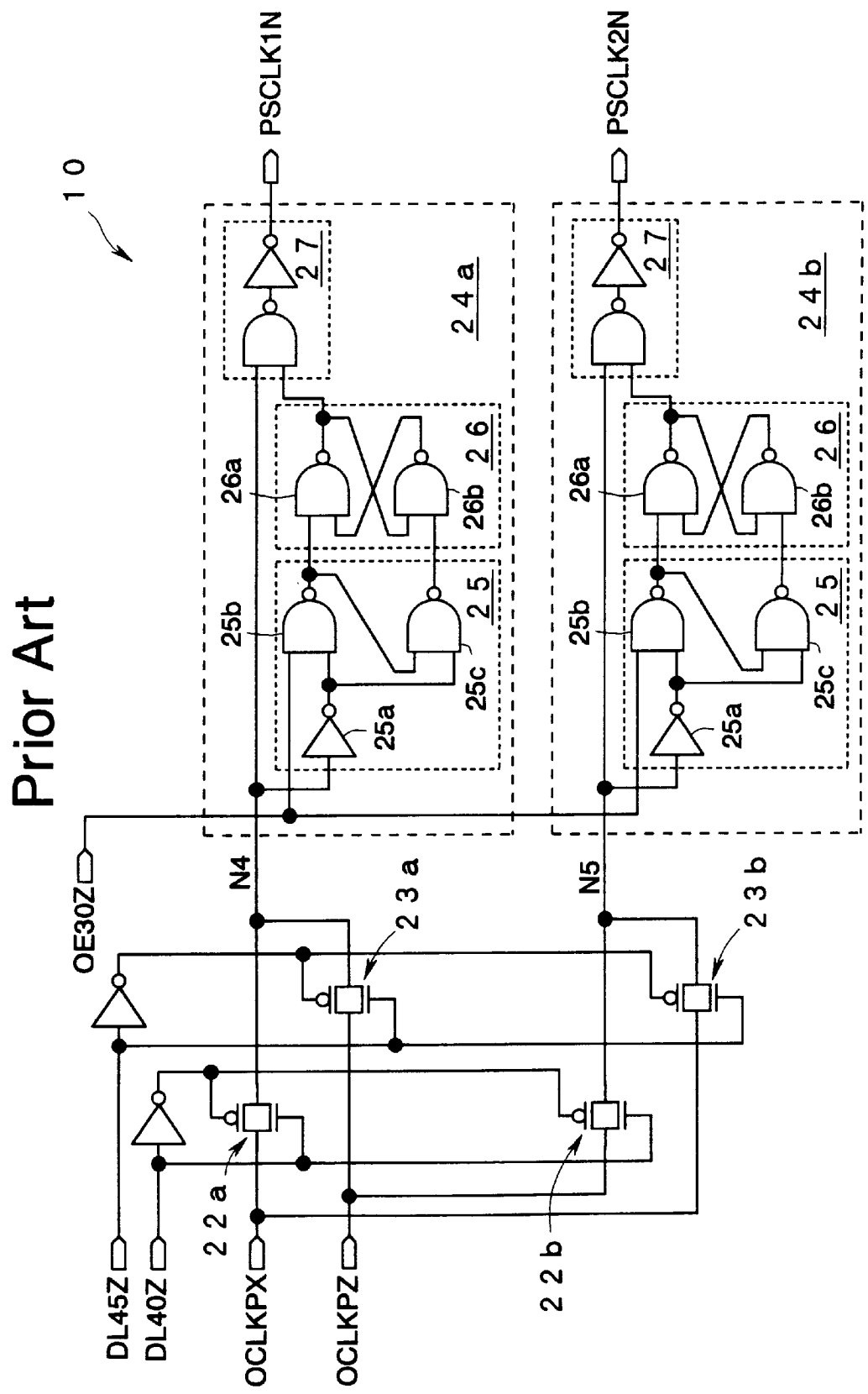
FIG. 5 is a circuit diagram showing a data converting pulse switching circuit of the prior art.
Figure 6:
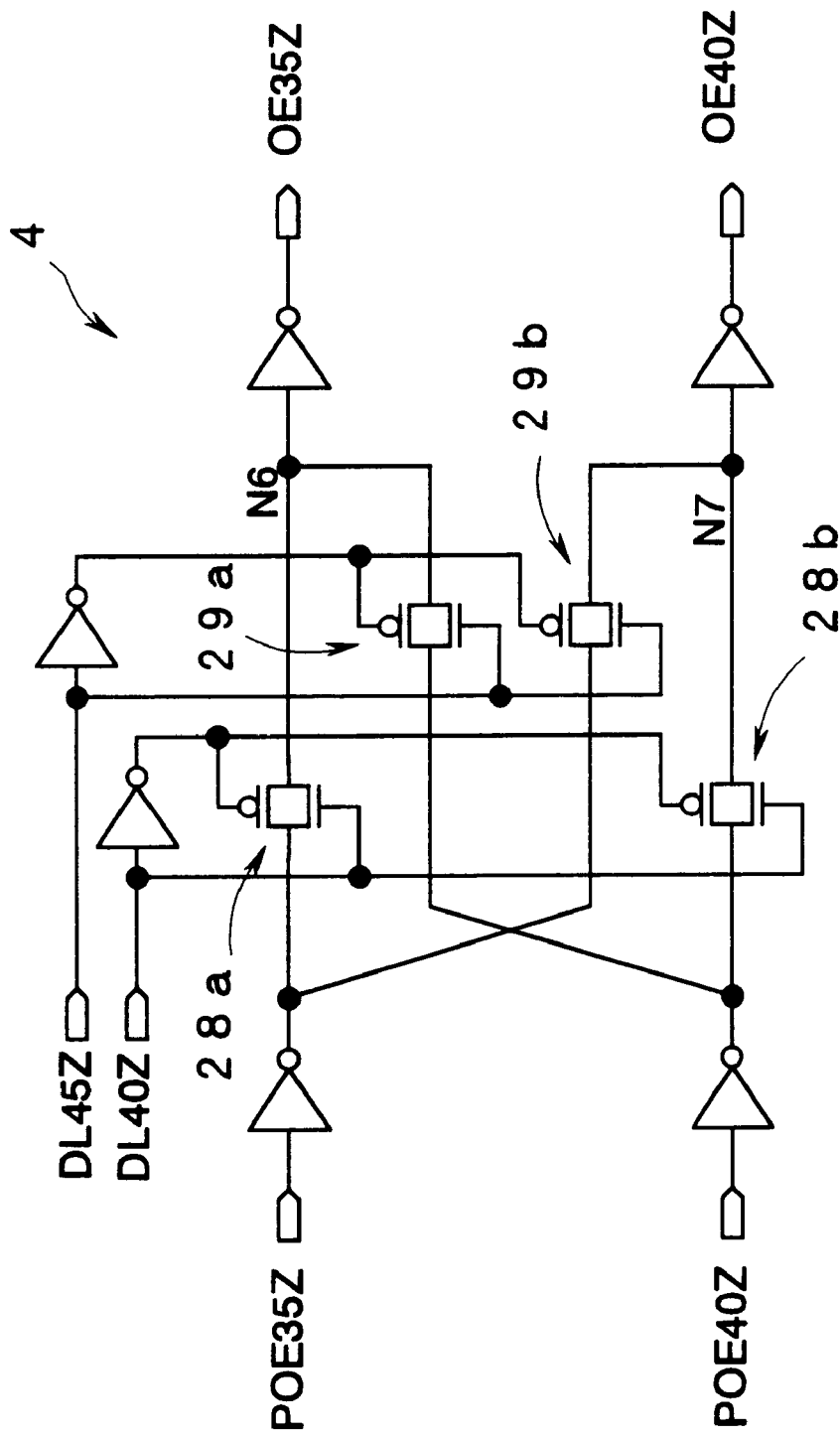
FIG. 6 is a circuit diagram showing an output enable switching circuit of the prior art.
Figure 7:
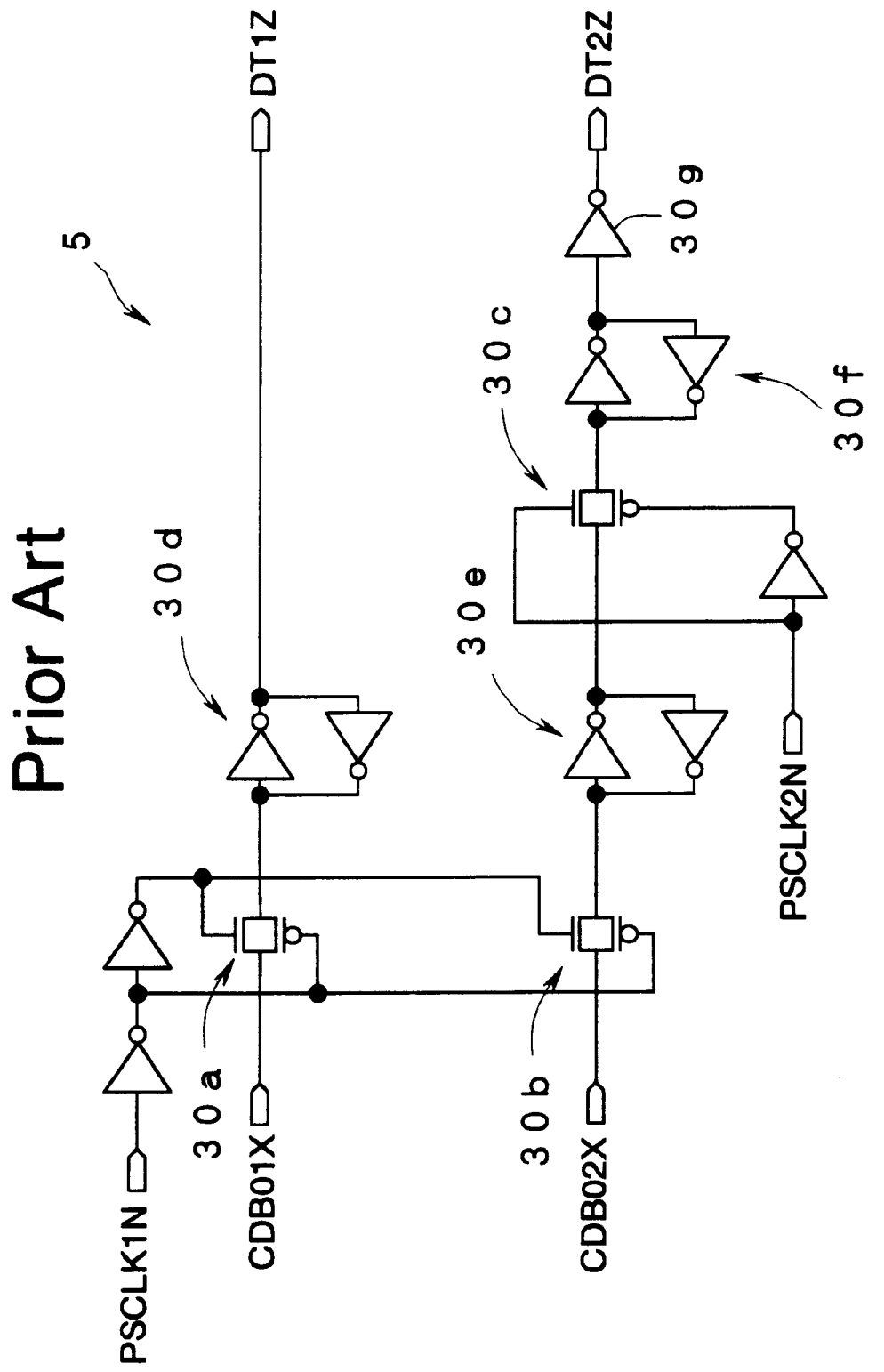
FIG. 7 is a circuit diagram showing a data transmitting circuit of the prior art.
Figure 8:
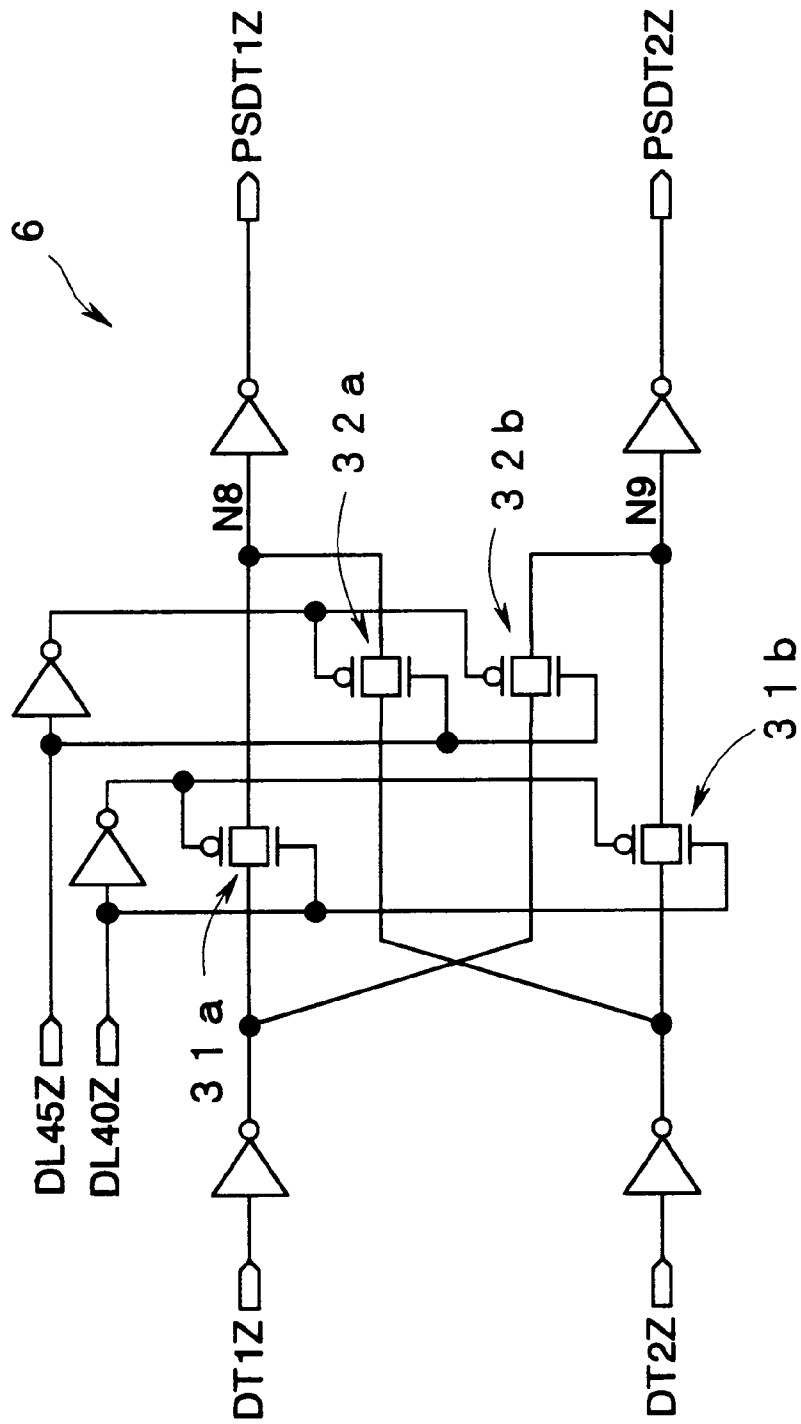
FIG. 8 is a circuit diagram showing a data switching circuit of the prior art.
Figure 9:
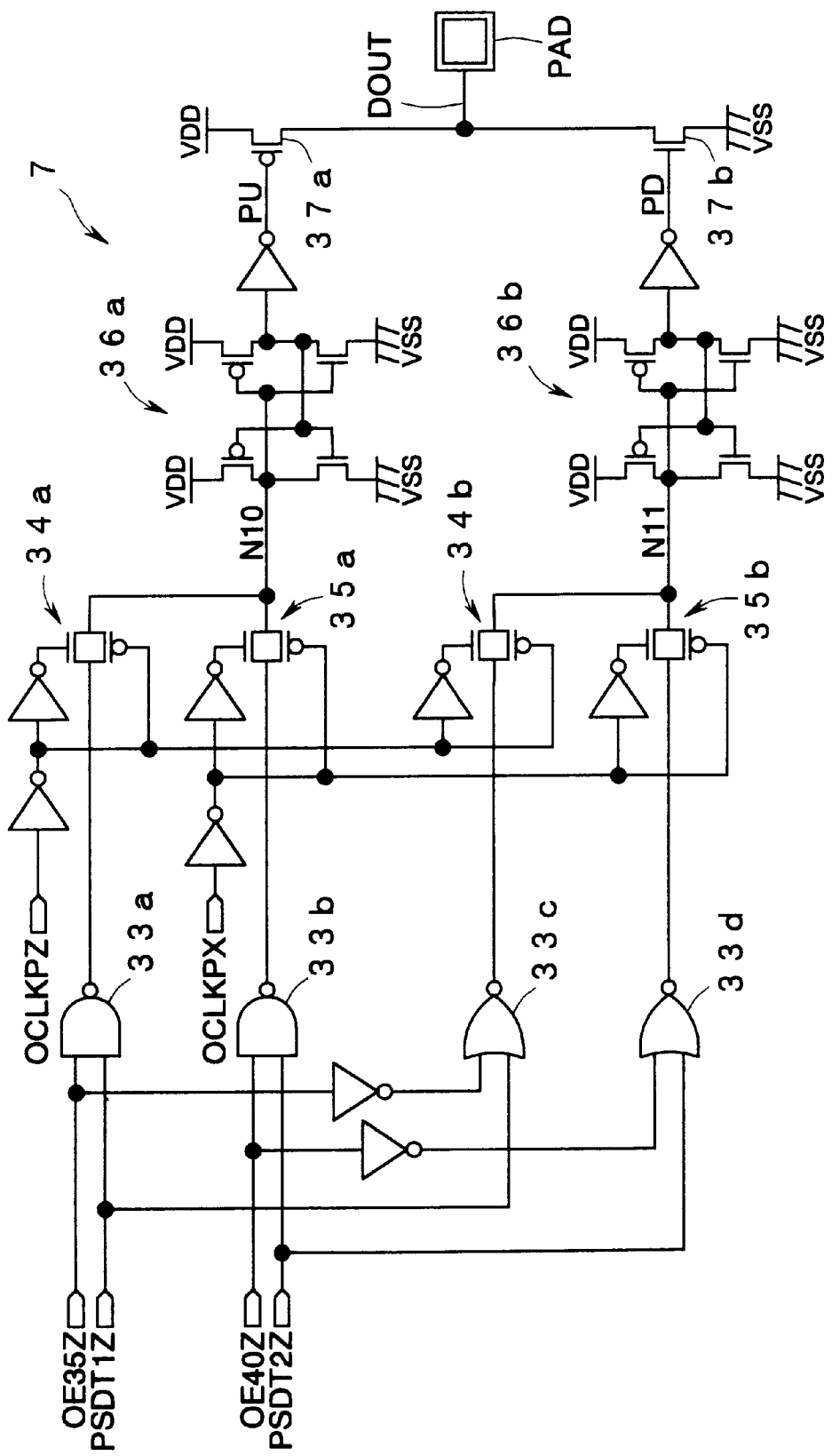
FIG. 9 is a circuit diagram showing a data output circuit of the prior art.

A semiconductor integrated circuit of the invention will be described in connection with its one embodiment with reference to the accompanying drawings.

The semiconductor integrated circuit of this embodiment is formed as a DDR-SDRAM of 64 Mbits, for example, on a silicon substrate by using the CMOS process technology. The DDR-SDRAM includes a peripheral circuit unit and a memory core unit same as the ordinary semiconductor memory. An output controlling unit and an input controlling unit, as will be described hereinafter, are formed in the peripheral circuit unit. A memory cell array having a plurality of memory cells and a sense amplifier and the like are formed in the memory core unit.

The same circuits as those described in the prior art are designated by the identical reference numerals, and their description will be omitted. Likewise, the same signals as those described in the prior art are designated by the identical numerals.

Figure 12:
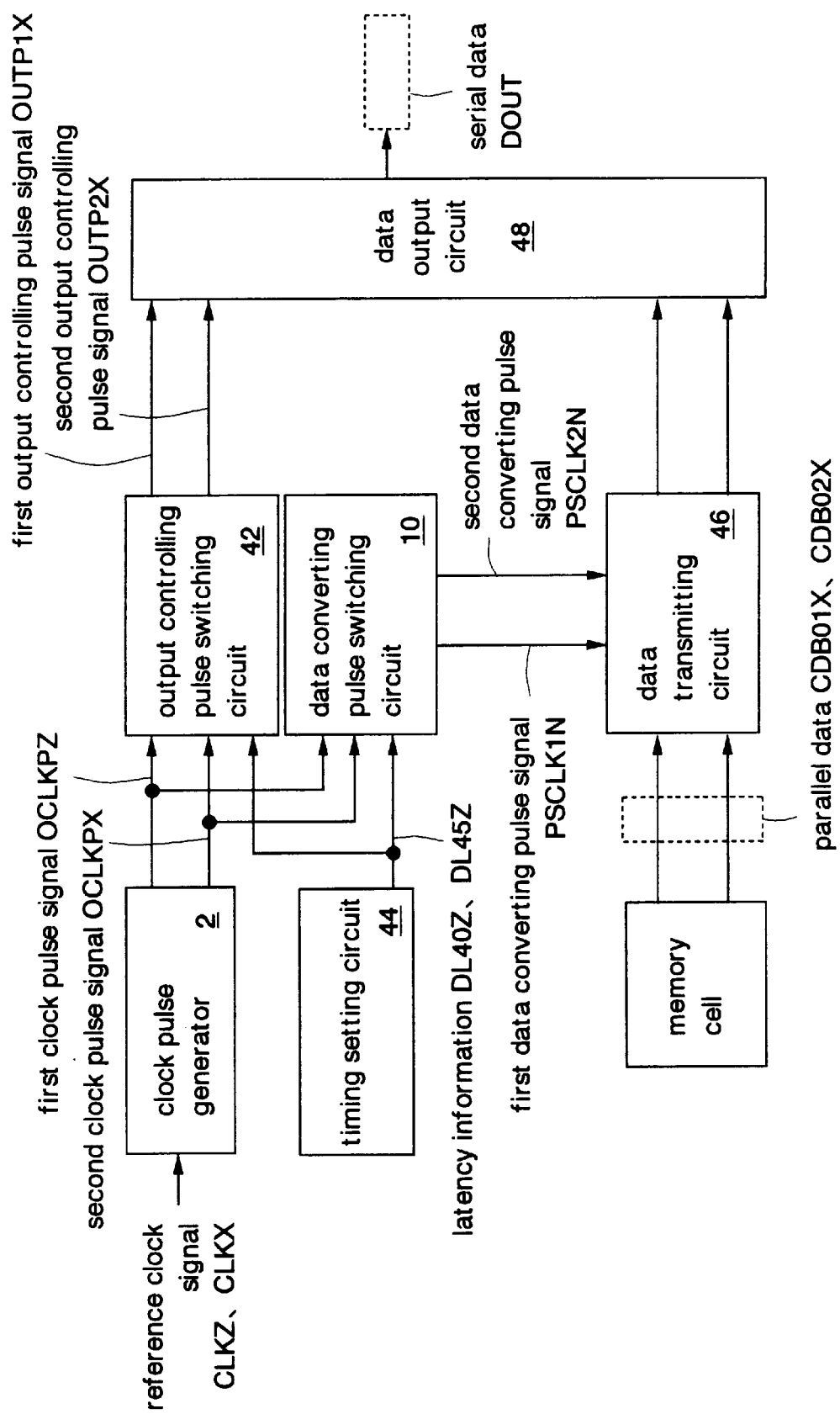
FIG. 12 is a block diagram showing a fundamental principle of a semiconductor integrated circuit of the invention.

FIG. 12 is a block diagram showing a basic principle of the semiconductor integrated circuit of the present invention. The clock pulse generator 2 generates a plurality of clock pulses OCLKPZ and OCLKPX, which have different phases during one cycle of the reference clock signal CLKZ (CLKX) supplied from the exterior. A timing setting circuit 44 sets the latency, which is a number of the clock cycles from the start of read operation the start of the output of read data DOUT, at a number which is divisible by one n-th (n=2, 3, 4 . . . ) of the cycle of the reference clock signal, and outputs latency controlling signals DL40Z and DL45Z for transmitting latency information according to the set latency. In accordance with the set latency controlling signals DL40Z and DL45Z, an output controlling pulse switching circuit 42 outputs the clock pulses OCLKPZ and OCLKPX, respectively, as predetermined output controlling pulses OUTP1X and OUTP2X. In other words, the output controlling pulses OUTP1X and OUTP2X are switched in accordance with the latency controlling signals DL40Z and DL45Z. A data output circuit 48 sequentially converts the parallel data CDB01X and CDB02X, as read from a plurality of memory cells MC, into the serial data DOUT during a predetermined period according to the latency, respectively, in synchronization with the output controlling pulses OUTP1X and OUTP2X, and outputs the converted serial data DOUT.

On the other hand, in accordance with the set latency controlling signals DL40Z and DL45Z, the data converting pulse switching circuit 10 outputs the clock pulses OCLKPZ and OCLKPX, respectively, as the predetermined data converting pulses PSCLK1N and PSCLK2N. In synchronization with the data converting pulses PSCLK1N and PSCLK2N, respectively, a data transmitting circuit 46 sequentially transmits each of the parallel data CDB01X and CDB02X to the data output circuit 48. As a result, the parallel data CDB01X and CDB02X are always transmitted in a predetermined sequence to the data output circuit 48.

Figure 13:
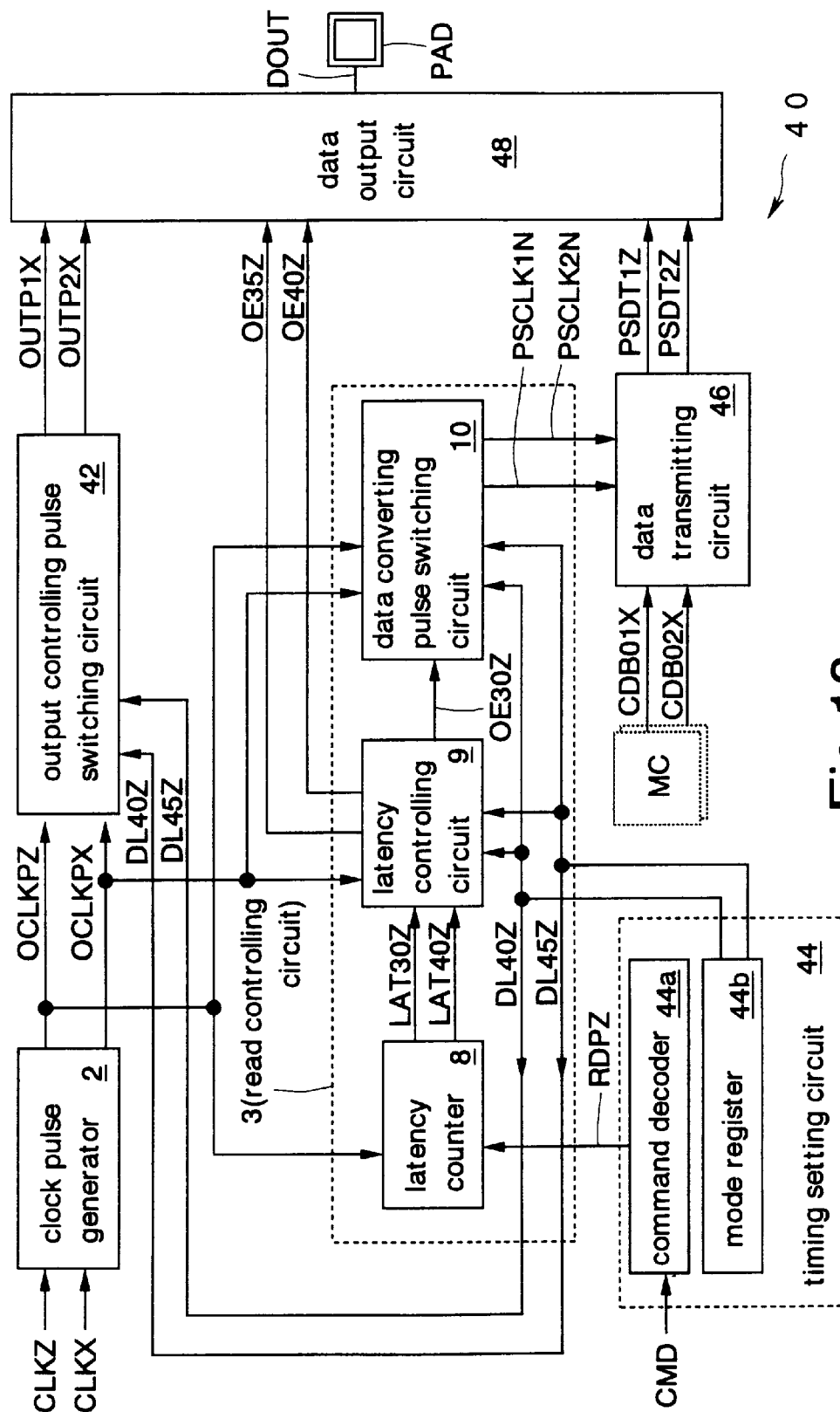
FIG. 13 is a block diagram showing an output controlling unit in one embodiment of the semiconductor integrated circuit of the invention.

FIG. 13 shows an output controlling unit 40 for controlling the output of data signals.

This output controlling unit 40 includes a clock pulse generator 2, a output controlling pulse switching circuit 42, a timing setting circuit 44, a read controlling circuit 3, a data transmitting circuit 46 and a data output circuit 48. The clock pulse generator 2, the output controlling pulse switching circuit 42, the timing setting circuit 44 and the read controlling circuit 3 are shared for all the I/O signals, and the data transmitting circuit 46 and the data output circuit 48 respectively operate for each of the I/O signals. The clock pulse generator 2 and the read controlling circuit 3 are identical to those of the prior art.

The clock pulse generator 2 receives the clock signals CLKZ and CLKX and outputs the clock pulses OCLKPZ and OCLKPX in synchronization with the rises of the clock signals CLKZ and CLKX. The clock signals CLKZ and CLKX correspond to the reference clock signals, and the clock pulses OCLKPZ and OCLKPX correspond to the first clock pulse and the second clock pulse.

The output controlling pulse switching circuit 42 receives the clock pulses OCLKPZ and OCLKPX and the latency controlling signals DL40Z and DL45Z, and outputs the output controlling pulses OUTP1X and OUTP2X. The output controlling pulses OUTP1X and OUTP2X correspond to the first output controlling pulse and the second output controlling pulse. The latency controlling signals DL40Z and DL45Z correspond to the latency information.

The timing setting circuit 44 includes a command decoder 44a for receiving a command signal CMD supplied from the exterior, and a mode register 44b which can be set at the exterior. The command decoder 44a is a circuit for outputting the read controlling signal RDPZ when it determines the command signal CMD accepted is a read command. The mode register 44b is a circuit for outputting the latency controlling signals DL40Z and DL45Z, respectively, in accordance with the "latency 4" and the "latency 4.5" to be set.

In response to the clock pulses OCLKPZ and OCLKPX, the read controlling signal RDPZ and the latency controlling signals DL40Z and DL45Z, the read controlling circuit 3 outputs the output controlling signals OE35Z and OE40Z and the data converting pulses PSCLK1N and PSCLK2N. The data converting pulses PSCLK1N and PSCLK2N correspond to the first data converting pulse and the second data converting pulse.

In response to the data signals CDB01X and CDB02X read in parallel from a plurality memory cells MC and the data converting pulses PSCLK1N and PSCLK2N, the data transmitting circuit 46 outputs them as the data signals PSDT1Z and PSDT2Z. Here, the memory cell array is formed of a plurality of memory cells MC. This memory cell array is connected with the output controlling unit 40.

In response to the output controlling pulses OUTP1X and OUTP2X, the output controlling signals OE35Z and OE40Z and the data signals PSDT1Z and PSDT2Z, the data outputting circuit 48 outputs the serial data signals DOUT to the pad PAD.

Figure 14:
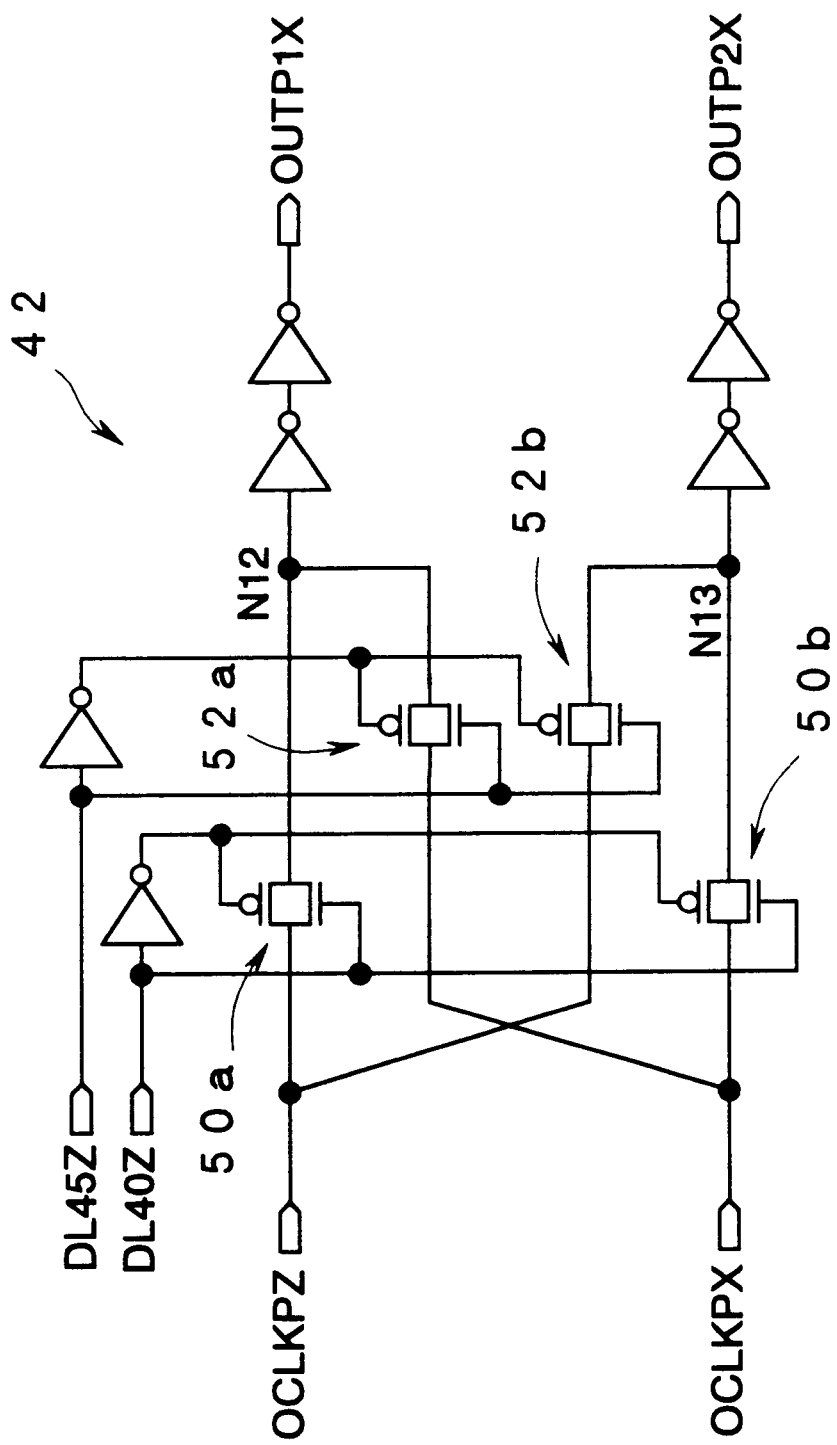
FIG. 14 is a circuit diagram showing an output controlling pulse switching circuit of FIG. 13.

FIG. 14 shows a detail of the output controlling pulse switching circuit 42.

This output controlling pulse switching circuit 42 includes: CMOS transmission gates 50a and 50b to be turned on when the latency controlling signal DL40Z is at the high level; CMOS transmission gates 52a and 52b to be turned on when the latency controlling signal DL45Z is at the high level; and a plurality of inverters.

The CMOS transmission gate 50a receives the clock pulse OCLKPZ and outputs the received signal to a node N12. The CMOS transmission gate 50b receives the clock pulse OCLKPX and outputs the received signal to a node N13. The CMOS transmission gate 52a receives the clock pulse OCLKPX and outputs the received signal to the node N12. The CMOS transmission gate 52b receives the clock pulse OCLKPZ and outputs the received signal to the node N13.

The signal, as transmitted to the node N12, is outputted as an output controlling pulse OUTPLX through the two inverters connected in cascade. The signal, as transmitted to the node N13, is outputted as an output controlling pulse OUTP2X through the two inverters connected in cascade.

The output controlling pulse switching circuit 42 outputs the clock pulses OCLKPZ and OCLKPX, respectively, as the output controlling pulses OUTP1X and OUTP2X when the mode register is set at the "latency 4". The output controlling pulse switching circuit 42 outputs the clock pulses OCLKPX and OCLKPZ, respectively, as the output controlling pulses OUTP1X and OUTP2X when the mode register is set at the "latency 4.5".

Figure 15:
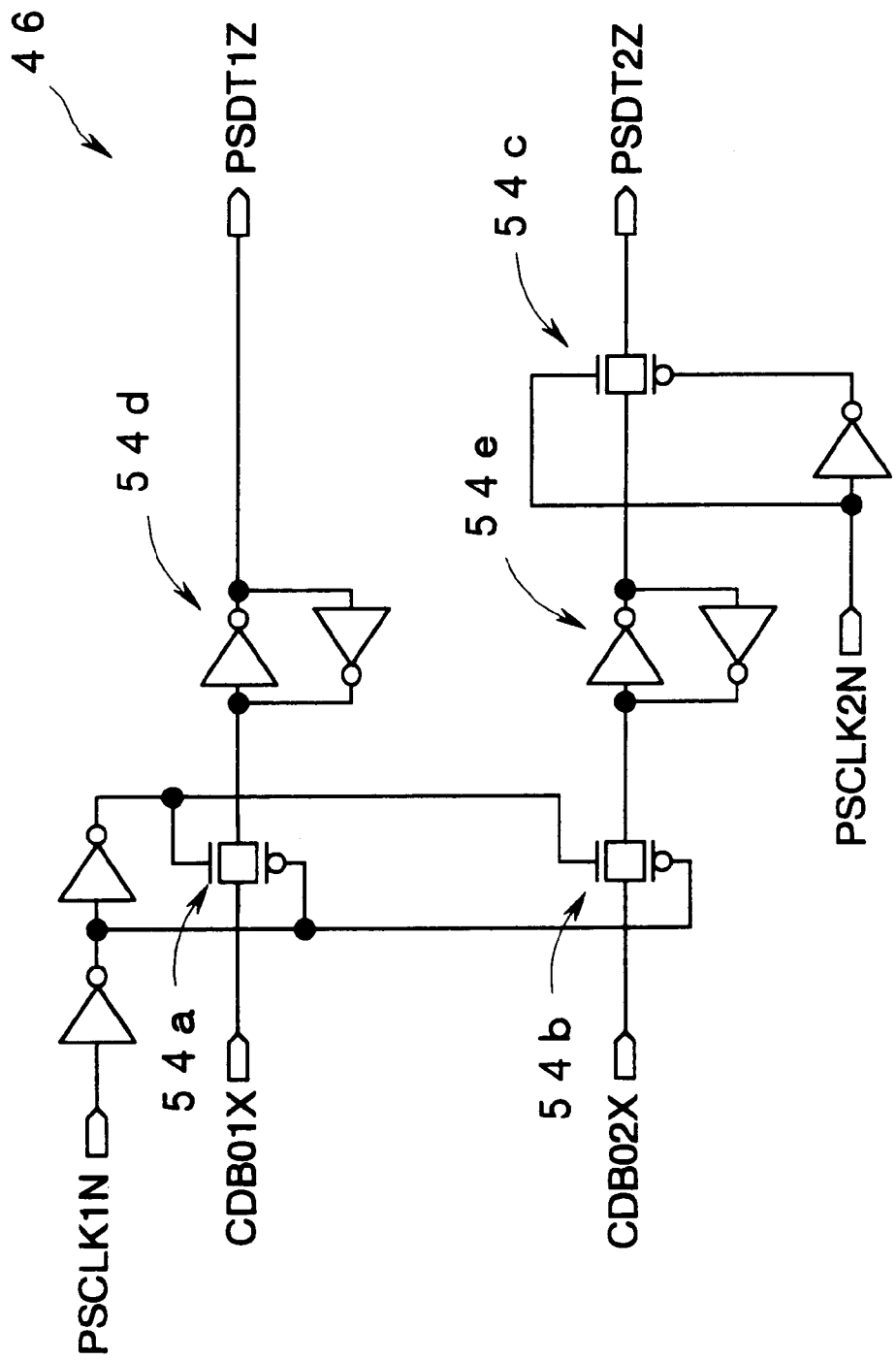
FIG. 15 is a circuit diagram showing a data transmitting circuit of FIG. 13.

FIG. 15 shows the data transmitting circuit 46 in detail.

The data transmitting circuit 46 includes CMOS transmission gates 54a and 54b, a CMOS transmission gate 54c, latches 54d and 54e and a plurality of inverters. The CMOS transmission gates 54a and 54b are turned on when the data converting pulse PSCLKLN is at the high level. The CMOS transmission gate 54c is turned on when the data converting pulse PSCLK2N is at the high level. The latches 54d and 54e are formed by connecting the inputs and outputs of the two inverters.

The CMOS transmission gate 54a receives the data signal CDB01X and outputs the received signal to the latch 54d. This latch 54d inverts the data signal CDB01X and outputs the inverted signal as the data signal PSDT1Z. The CMOS transmission gate 54b receives the data signal CDB02X and outputs the received signal to the latch 54e. This latch 54e inverts the data signal CDB02X and outputs the inverted signal to the CMOS transmission gate 54c. This CMOS transmission gate 54c outputs the received signal as the data signal PSDT2Z.

Figure 16:
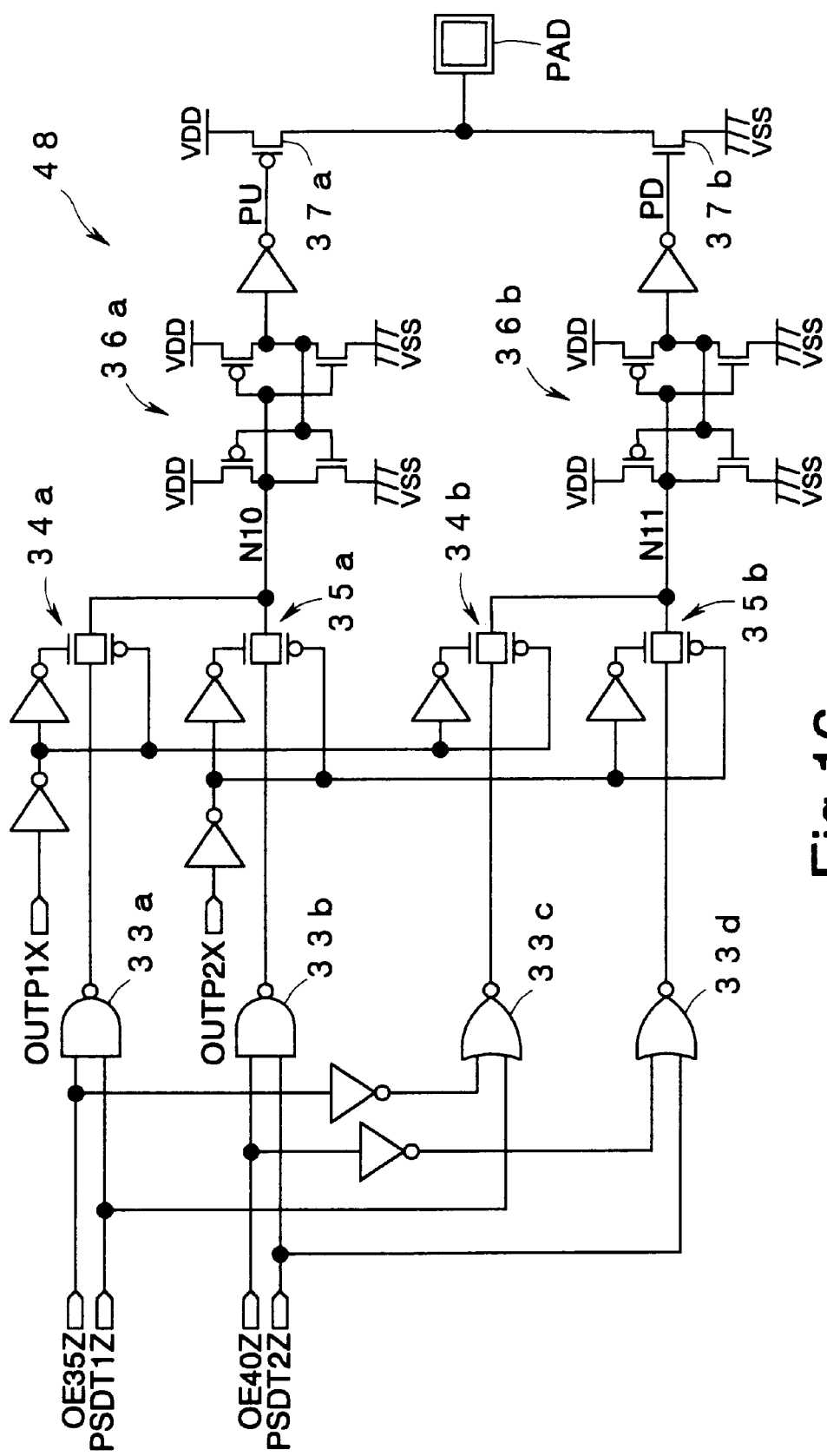
FIG. 16 is a circuit diagram showing a data output circuit of FIG. 13.

FIG. 16 shows a detail the data outputting circuit 48.

This data outputting circuit 48 is identical to the data outputting circuit 7 except that the CMOS transmission gates 34a, 34b, 35a and 35b are controlled with the output controlling pulses OUTP1X and OUTP2X. Specifically, the output controlling pulse OUTP1X controls the CMOS transmission gates 34a and 34b, and the output controlling pulse OUTP2X controls the CMOS transmission gates 35a and 35b.

In the DDR-SDRAM described above, the read operation is performed as follows according to the "latency", as set at the exterior.

Figure 10:
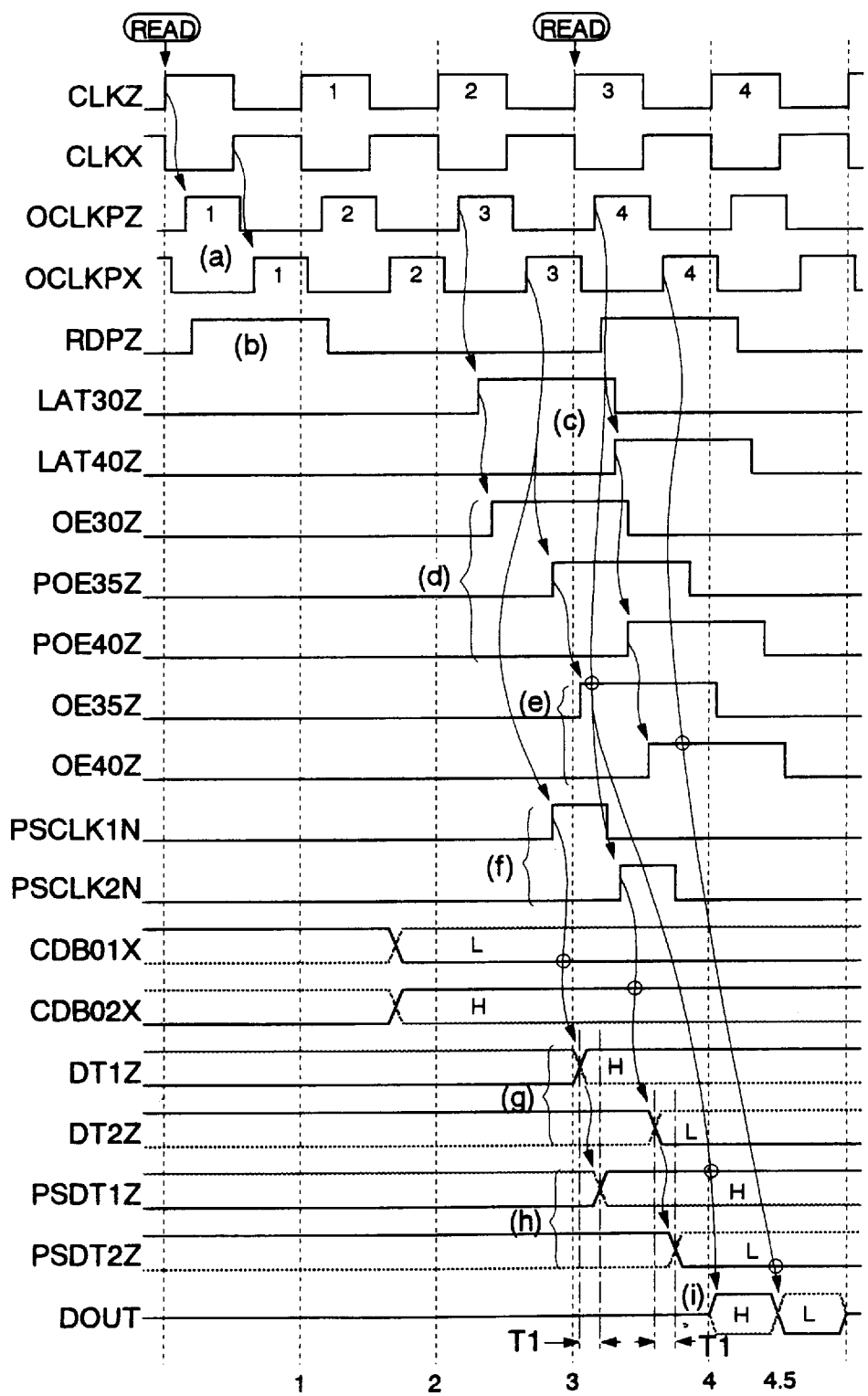
FIG. 10 is a timing chart showing a read operation when the DDR-SDRAM of the prior art is set at a "latency 4"
Figure 17:
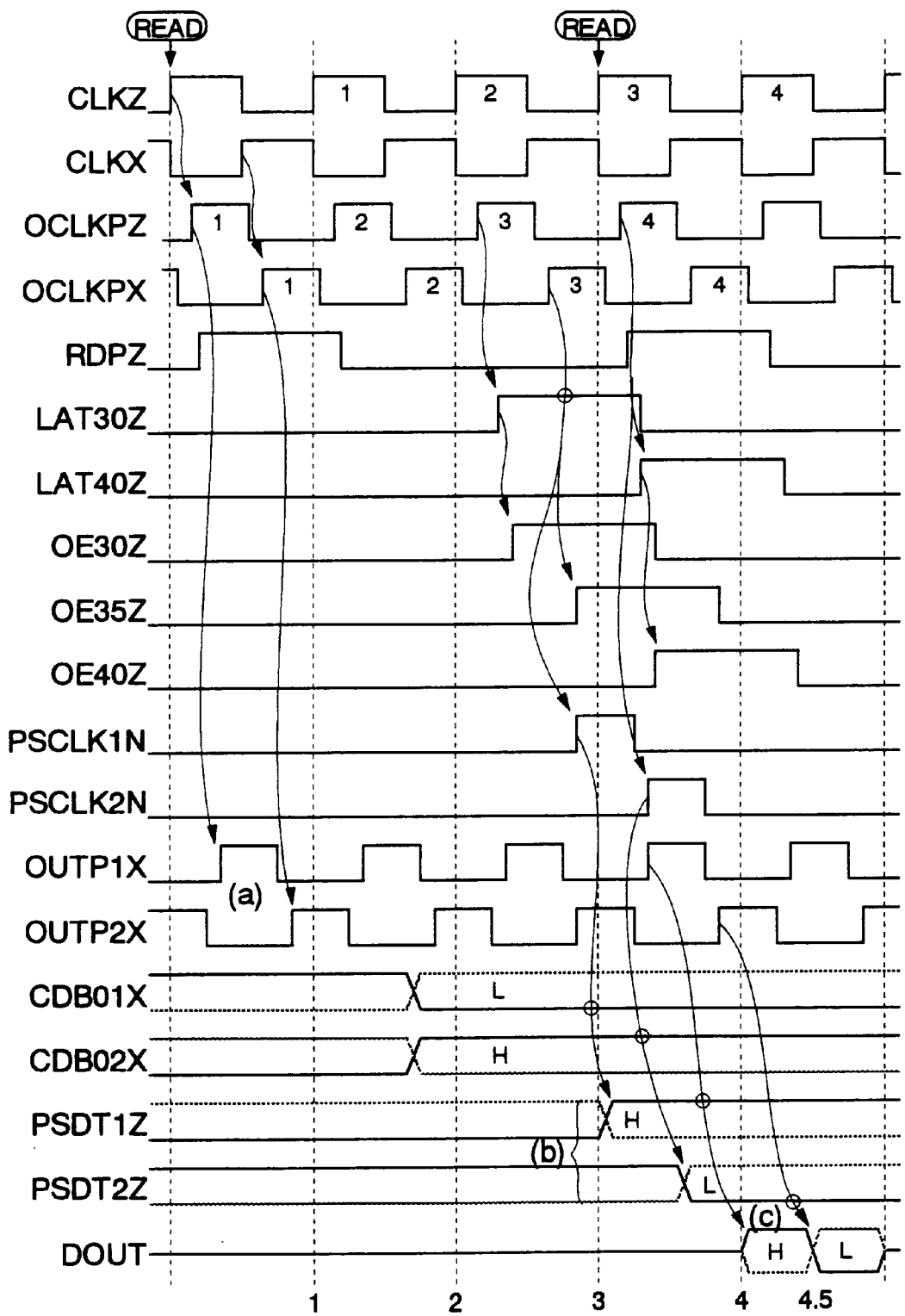
FIG. 17 is a timing chart showing a read operation when the semiconductor integrated circuit of the invention is set at the "latency 4"

FIG. 17 shows timings of the read operation when the "latency 4" is set. At this time, the latency controlling signal DL40Z is set to the high level, and the latency controlling signal DL45Z is set to the low level. The generation timings for the clock pulses OCLKPZ and OCLKPX, the read controlling signal RDPZ, the latency delay signals LAT30Z and LAT40Z, the output controlling signals OE30Z, OE35Z and OE40Z and the data converting pulses PSCLK1N and PSCLK2N are identical to those of FIG. 10, as described in connection with the prior art, and their description will be omitted.

In response to the high level of the latency controlling signal DL40Z, the output controlling pulse switching circuit 42 of FIG. 14 outputs the clock pulses OCLKPZ and OCLKPX, respectively, as the output controlling pulses OUTP1X and OUTP2X (FIG. 17(*a*)).

The data transmitting circuit 46 of FIG. 15 accepts the data signal CDB01X at the low level (L) read from the memory cells MC, in synchronization with the rise of the data converting pulse PSCLK1N, inverts the accepted signal, and outputs the inverted signal as the data signal PSDT1Z at the high level (H). On the other hand, the data transmitting circuit 46 accepts the data signal CDB02X at the high level (H) in synchronization with the rise of the data converting pulse PSCLK2N, inverts the accepted signal, and outputs the inverted signal as the data signal PSDT2Z at the low level (L) (FIG. 17(*b*)). Here, the data signals CDB01X and CDB02X have negative logics. Therefore, the logic level of the data signals CDB01X and CDB02X is inverted from that of the data signal DOUT to be outputted to the exterior. The data signals PSDT1Z and PSDT2Z are outputted earlier than those in the prior art because of having no data switching circuit in this embodiment. In other words, there is no time corresponding to the time T1 shown in FIG. 10. As a result, the data can be outputted in the same latency even when the frequency of the clock signal CLKZ is increased.

The data outputting circuit 48 of FIG. 16 accepts the data signals PSDT1Z (at the high level) in synchronization with the rise of the output controlling pulse OUTP1X which is generated during the high-level period of the output controlling signal OE35Z. The data outputting circuit 48 sets the control signal PU and the control signal PD, respectively, to the low level and the high level, and outputs the data signal DOUT at the high level to the PAD in synchronization with the fourth (corresponding to the numeral, as indicated by waveforms) rise of the clock signal CLKZ. Next, the data outputting circuit 48 accepts the data signal PSDT2Z (at the low level) in synchronization with the rise of the output controlling pulse OUTP2X during the high-level period of the output controlling signal OE40Z. The data outputting circuit 48 sets the control signal PU and the control signal PD, respectively, to the high level and the low level, and outputs the data signal DOUT at the low level to the pad PAD in synchronization with the fourth fall of the clock signal CLKZ. As a result, the data signals CDB01X and CDB02X, as read from the memory cells MC, are sequentially outputted to the exterior in synchronization with the rise and fall of the clock signal CLKZ (or in synchronization with the rises of the clock signals CLKZ and CLKX), respectively (FIG. 17(c)).

Here in FIG. 17, the next read command is supplied in synchronization with the rise of the third clock signal CLKZ.

Figure 11:
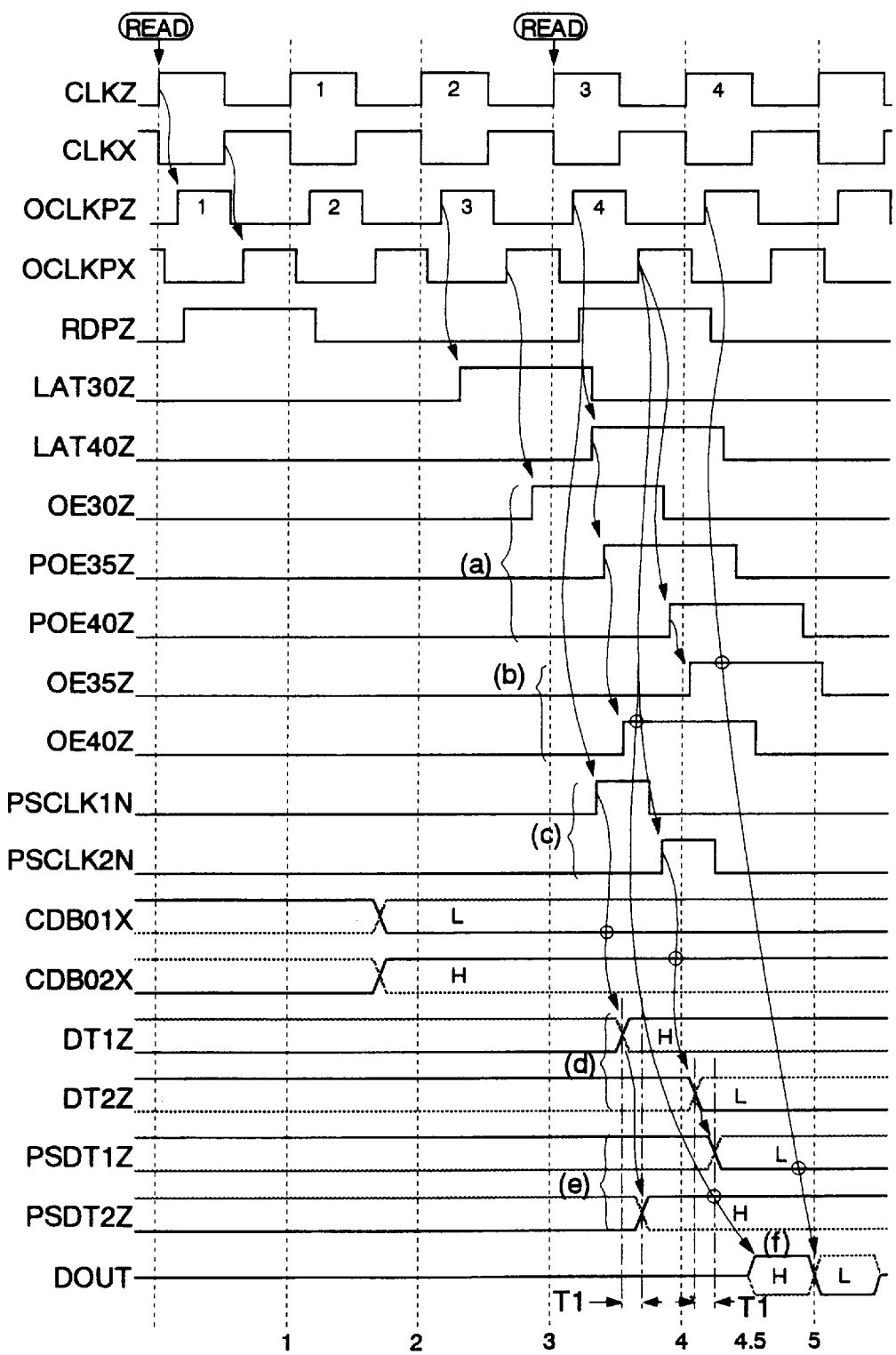
FIG. 11 is a timing chart showing a read operation when the DDR-SDRAM of the prior art is set at a "latency 4.5"
Figure 18:
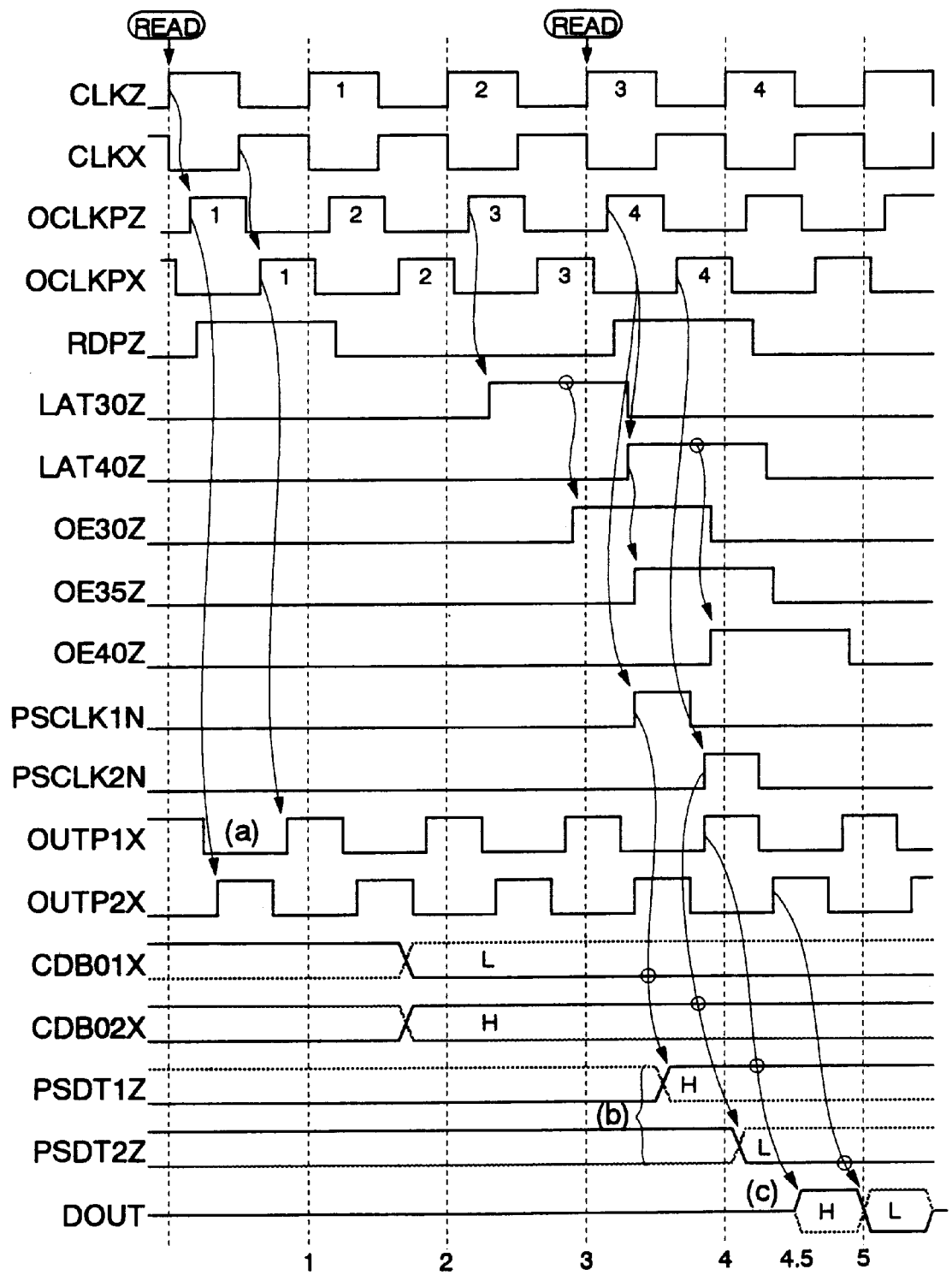
FIG. 18 is a timing chart showing a read operation when the semiconductor integrated circuit of the invention is set at the "latency 4.5".

FIG. 18 shows timings of the read operation when the "latency 4.5" is set. At this time, the latency controlling signal DL40Z is set to the low level, and the latency controlling signal DL45Z is set to the high level. The generation timings for the clock pulses OCLKPZ and OCLKPX, the read controlling signal RDPZ, the latency delay signals LAT30Z and LAT40Z, the output controlling signals OE30Z, OE35Z and OE40Z and the data converting pulses PSCLK1N and PSCLK2N are identical to those of FIG. 11, as described in connection with the prior art, and their description will be omitted.

In response to the high level of the latency controlling signal DL45Z, the output controlling pulse switching circuit 42 of FIG. 14 respectively outputs the clock pulses OCLKPZ and OCLKPX as the output controlling pulses OUTP2X and OUTPLX (FIG. 18(a)). In short, the output controlling pulses OUTP2X and OUTPLX are oppositely switched in the "latency 4" and a latency 4.5".

The data transmitting circuit 46 of FIG. 15 accepts the data signal CDB01X at the low level (L) in synchronization with the rise of the data converting pulse PSCLK1N, inverts the accepted signal, and outputs the inverted signal as the data signal PSDT1Z at the high level (H). On the other hand, the data transmitting circuit 46 accepts the data signal CDB02X at the high level (H) in synchronization with the rise of the data converting pulse PSCLK2N, inverts the accepted signal, and outputs the inverted signal as the data signal PSDT2Z at the low level (L) (FIG. 18(b)). In short, the data signals CDB01X and CDB02X are accepted as in FIG. 17 in synchronization with the data converting pulses PSCLK1N and PSCLK2N, respectively. As a result, the data signals PSDT1Z and PSDT2Z are outputted earlier than the prior art even if the "latency 4.5" is set.

The data outputting circuit 48 of FIG. 16 accepts the data signals PSDT1Z (at the high level) in synchronization with the rise of the output controlling pulse OUTP1X which is generated during the high-level period of the output controlling signal OE35Z. The data outputting circuit 48 sets the control signal PU and the control signal PD, respectively, to the low level and the high level, and outputs the data signal DOUT at the high level to the pad PAD in synchronization with the fourth (corresponding to the numeral, as indicated by waveforms) fall of the clock signal CLKZ. Next, the data outputting circuit 48 accepts the data signal PSDT2Z (at the low level) in synchronization with the rise of the output controlling pulse OUTP2X generated during the high-level period of the output controlling signal OE40Z. The data outputting circuit 48 sets the control signal PU and the control signal PD, respectively, to the high level and the low level, and outputs the data signal DOUT at the low level to the pad PAD in synchronization with the fourth fall of the clock signal CLKZ. As a result, the inverted signals of the data signals CDB01X and CDB02X, as read from the memory cells MC, are sequentially outputted to the exterior in synchronization with the rise and fall of the clock signal CLKZ (or in synchronization with the rises of the clock signals CLKZ and CLKX), respectively (FIG. 18(c)).

In the semiconductor integrated circuit of the present invention described above, the output controlling pulses OUTP1X and OUTP2X are switched, and the data converting pulses PSCLK1N and PSCLK2N are switched in accordance with the set latencies DL40Z and DL45Z. No matter whether the latencies DL40Z and DL45Z might be set at the rise or fall of the reference clock signal CLKZ, therefore, the data signal DOUT can be outputted without switching the data signals CDB01X and CDB02X. Thus, the delay of the data signals CDB01X and CDB02X can be minimized to output the data signal DOUT at high speed. As a result, the data signal DOUT can be outputted in the same latency even when the frequencies of the clock signals CLKZ and CLKX are set high. In short, the access time at the read operation can be shortened.

The clock pulses OCLKPZ and OCLKPX can be generated from the complementary clock signals CLKZ and CLKX supplied from the exterior so that the clock pulse generator 2 can be constructed of the simple circuit.

The data converting pulses PSCLK1N and PSCLK2N for controlling the data transmitting circuit 46 are switched according to the settings of the latencies DL40Z and DL45Z. Thus, the data signals CDB01X and CDB02X can be always transmitted in the predetermined sequence to the data outputting circuit 48.

The circuit scale can be made small because the output enable switching circuit 4 and the data switching circuit 6 are unnecessary unlike in the prior art. Therefore, the chip size can be small.

Here, the foregoing embodiment has been described on the case in which the present invention is applied to the DDRSDRAM. However, the invention should not be limited to the above embodiments. It can be applied to a semiconductor integrated circuit for outputting a plurality of read data during one cycle of a clock signal. The invention can be also applied to a system LSI in which a plurality of memory cores of the SDRAM are implemented.

The foregoing embodiment has been described on the case in which the "latency 4" or the "latency 4.5" is set. However, the invention should not be limited thereto, but similar effects could be obtained even if the "latency 3" or "latency 3.5", or "latency 5" or "latency 5.5" might be set.

The foregoing embodiment has been described on the case in which the clock pulses OCLKPZ and OCLKPX are generated in synchronization with the rises of the clock signals CLKZ and CLKX, respectively. However, the invention should not be limited thereto, but the clock pulses OCLKPZ and OCLKPX might be generated in synchronization with the rises and falls of the clock signal CLKZ, respectively.

Moreover, the invention can be applied to a semiconductor integrated circuit for outputting data four times during one cycle of the clock signal CLKZ. In this case, the mode register 44b of FIG. 13 is set at the "latency 4" or "latency 4.25". This semiconductor integrated circuit generates four clock pulses by using the clock signal CLKZ, and outputs the data by switching those clock pulses in accordance with the "latency".

The invention is not limited to the above embodiments and various modifications may be made without departing from the spirit and the scope of the invention. Any improvement may be made in part or all the components.

What is claimed is:

1. A semiconductor integrated circuit comprising:
   a plurality of memory cells for storing data;
   a clock pulse generator for generating a plurality of clock pulses having different phases during one cycle of a reference clock signal supplied from the exterior;
   a timing setting circuit for setting a latency, which is a number of clock cycles from a start of a read operation to an output of read data, at a number which is divisible by one n-th (n=2, 3, 4 . . . ) of a cycle of said reference clock signal and for outputting latency information according to the set latency;
   an output controlling pulse switching circuit for respectively outputting said clock pulses as predetermined output controlling pulses in accordance with said latency information; and
   a data outputting circuit for sequentially and respectively converting parallel data read from said memory cells into serial data and respectively outputting the converted serial data, in synchronization with said output controlling pulses during a predetermined period according to said set latency.

2. A semiconductor integrated circuit according to claim 1, further comprising:
   a data converting pulse switching circuit for respectively outputting each of said clock pulses as a predetermined data converting pulse in accordance with said latency information and
   a data transmitting circuit for sequentially transmitting said parallel data to said data outputting circuit in synchronization with said data converting pulses.

3. A semiconductor integrated circuit comprising:
   a plurality of memory cells for storing data;
   a clock pulse generator for respectively generating a first clock pulse and a second clock pulse in synchronization with the rises of a first reference clock signal and a second reference clock signal, complementary to each other, supplied from the exterior;
   a timing setting circuit for setting a latency, which is a number of clock cycles from a start of a read operation to an output of read data, at a number which is divisible by half a cycle of said reference clock signals, and for outputting latency information according to the set latency;
   an output controlling pulse switching circuit for respectively outputting said first clock pulse and said second clock pulse as either one of a first output controlling pulse or a second output controlling pulse in accordance with said latency information; and
   a data outputting circuit for sequentially and respectively converting parallel data read from said memory cells into serial data and outputting the converted serial data, in synchronization with said first output controlling pulse and said second output controlling pulse during the determined period according to said set latency.

4. A semiconductor integrated circuit comprising:
   a plurality of memory cells for storing data;
   a clock pulse generator for respectively generating a first clock pulse and a second clock pulse in synchronization with a rise and a fall of a reference clock signal supplied from the exterior;
   a timing setting circuit for setting a latency, which is a number of clock cycles from a start of a read operation to an output of read data, at a number which is divisible by half a cycle of said reference clock signal, and for outputting latency information according to the set latency;
   an output controlling pulse switching circuit for respectively outputting said first clock pulse and said second clock pulse as either one of a first output controlling pulse or a second output controlling pulse in accordance with said latency information; and
   a data outputting circuit for sequentially and respectively converting parallel data read from said memory cells into serial data and outputting the converted serial data, in synchronization with said first output controlling pulse and said second output controlling pulse during the predetermined period according to said set latency.

5. A semiconductor integrated circuit according to claim 3, further comprising:
   a data converting pulse switching circuit for respectively outputting said first clock pulse and said second clock pulse as either one of a first data converting pulse or a second data converting pulse in accordance with said latency information and
   a data transmitting circuit for sequentially transmitting said parallel data to said data outputting circuit in synchronization with said first data converting pulse and said second data converting pulse.

6. A semiconductor integrated circuit according to claim 4, further comprising:
   a data converting pulse switching circuit for respectively outputting each of said first clock pulse and said second clock pulse as either one of a first data converting pulse or a second data converting pulse in accordance with said latency information and
   a data transmitting circuit for sequentially transmitting said parallel data to said data outputting circuit in synchronization with said first data converting pulse and said second data converting pulse.

* * * * *